United States Patent
Hsu et al.

(10) Patent No.: US 12,139,394 B2
(45) Date of Patent: Nov. 12, 2024

(54) MULTIPLE LAYER ELECTRODE TRANSDUCERS

(71) Applicant: Soundskrit Inc., Montreal (CA)

(72) Inventors: Wan-Thai Hsu, Saline, MI (US); Hoyoun Jang, Ithaca, NY (US); Stephane Leahy, Montreal (CA); Bruce Diamond, San Jose, CA (US); Sahil Gupta, Montreal (CA)

(73) Assignee: Soundskrit Inc., Montreal (CA)

( * ) Notice: Subject to any disclaimer, the term of this patent is extended or adjusted under 35 U.S.C. 154(b) by 660 days.

(21) Appl. No.: 17/237,814

(22) Filed: Apr. 22, 2021

(65) Prior Publication Data
US 2021/0331912 A1   Oct. 28, 2021

Related U.S. Application Data

(60) Provisional application No. 63/013,939, filed on Apr. 22, 2020.

(51) Int. Cl.
| | | |
|---|---|---|
| B81B 3/00 | (2006.01) | |
| B81C 1/00 | (2006.01) | |
| H04R 7/06 | (2006.01) | |
| H04R 19/04 | (2006.01) | |
| H04R 31/00 | (2006.01) | |

(52) U.S. Cl.
CPC ........ B81B 3/0021 (2013.01); B81C 1/00166 (2013.01); H04R 7/06 (2013.01); H04R 19/04 (2013.01); H04R 31/003 (2013.01); *B81B 2201/0257* (2013.01); *B81B 2201/042* (2013.01); *B81B 2203/0127* (2013.01); *B81B 2203/0136* (2013.01); *B81B 2203/04* (2013.01); *B81C 2201/0132* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 6,744,173 B2 | 6/2004 | Behin et al. | |
| 7,357,874 B2 | 4/2008 | Moffat et al. | |
| 2002/0005976 A1* | 1/2002 | Behin | B81C 1/0015 359/254 |

* cited by examiner

*Primary Examiner* — Bo B Jang
(74) *Attorney, Agent, or Firm* — Lempia Summerfield Katz LLC

(57) ABSTRACT

An electrostatic transducer includes a substrate oriented in a plane, a fixed electrode supported by the substrate, and a moveable electrode supported by the substrate, spaced from the fixed electrode in a first direction parallel to the plane, and configured for movement in a second direction transverse to the plane, such that an extent to which the fixed and moveable electrodes overlap changes during the movement. The fixed and moveable electrodes comprise one or more of a plurality of conductive layers, the plurality of conductive layers including at least three layers. The fixed electrode includes a stacked arrangement of two or more spaced apart conductive layers of the plurality of conductive layers.

16 Claims, 25 Drawing Sheets

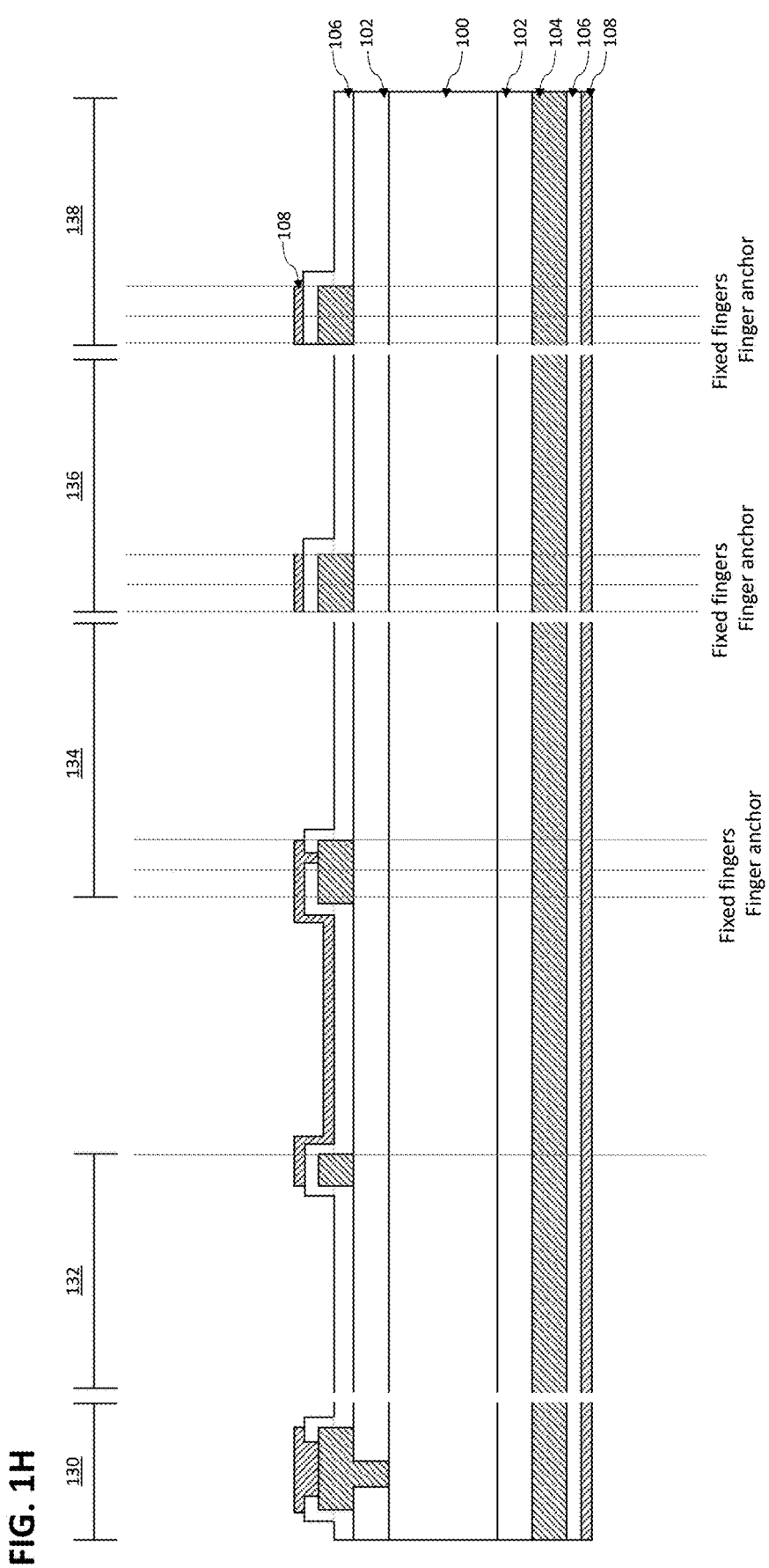

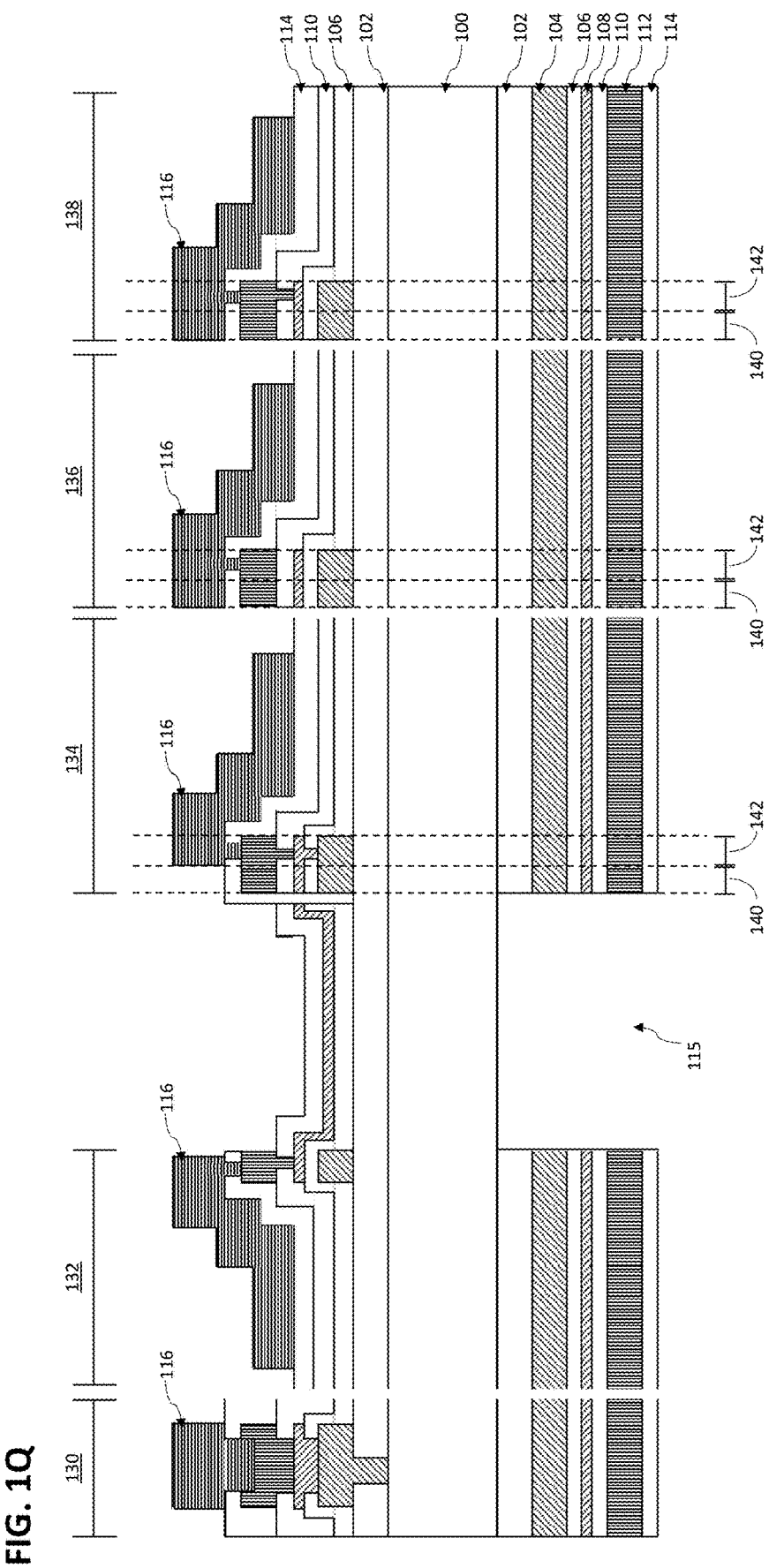

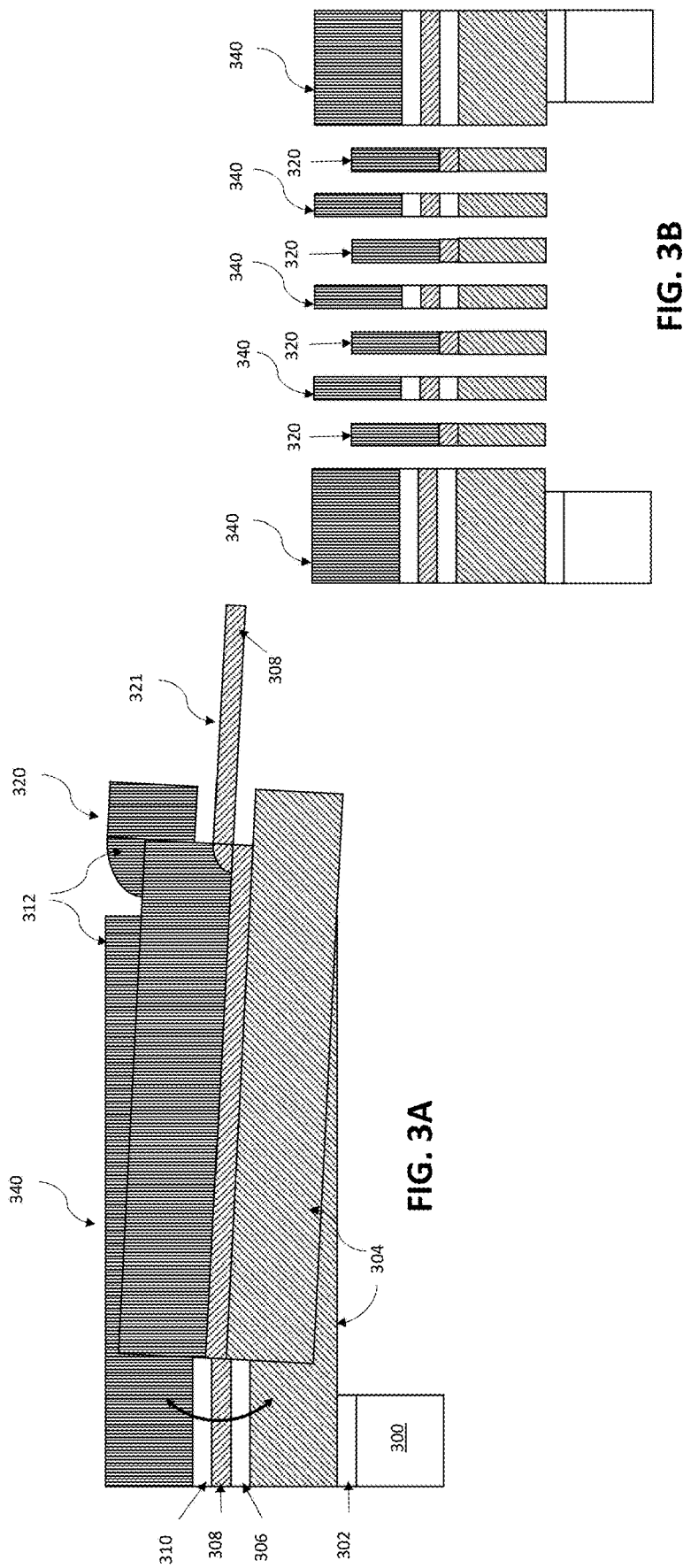

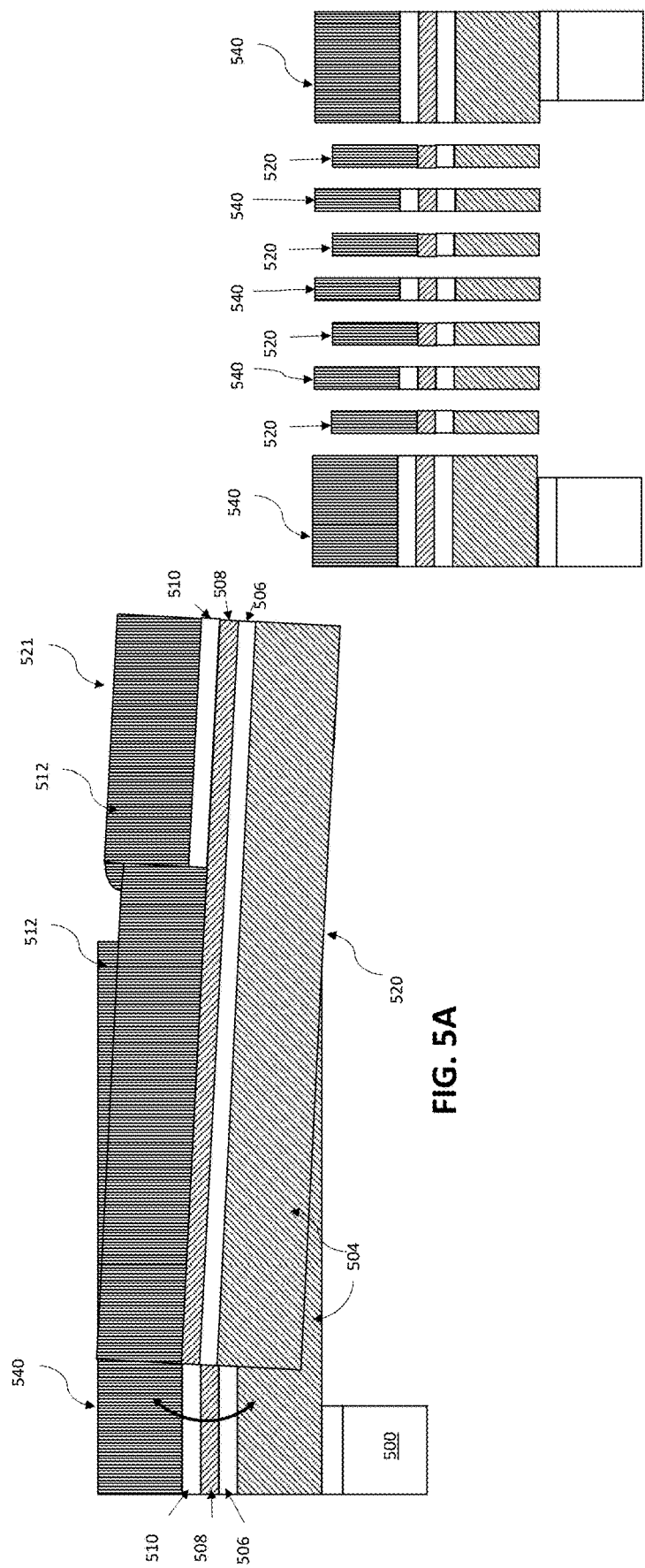

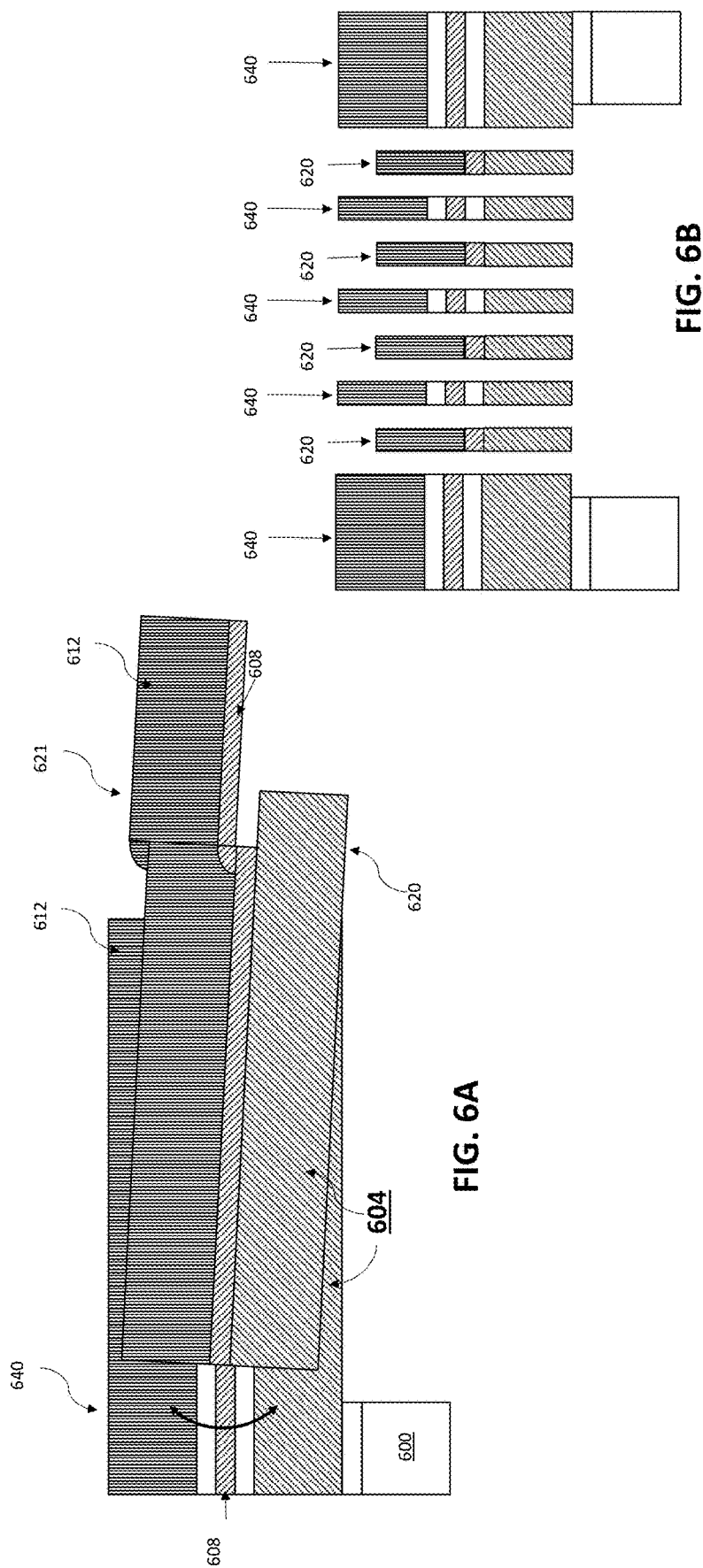

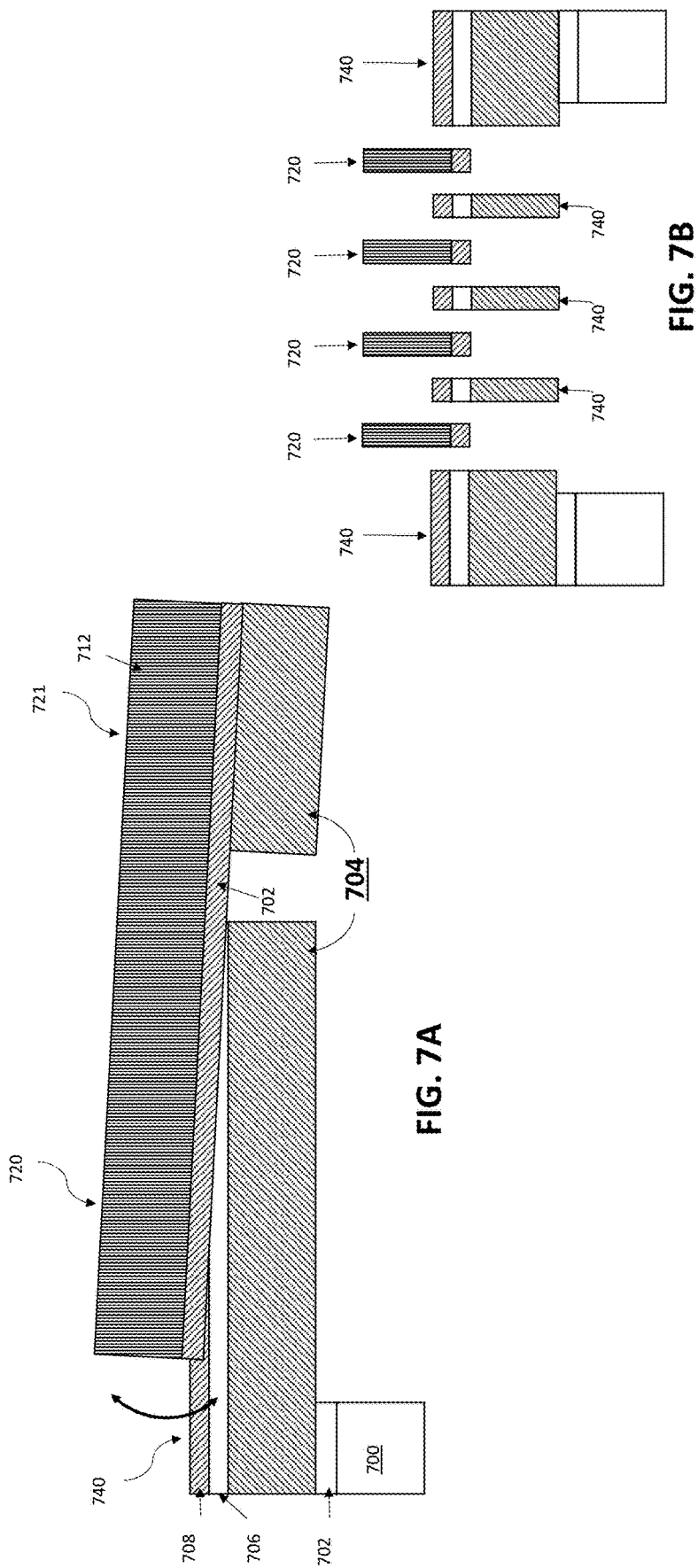

MULTIPLE LAYER ELECTRODE TRANSDUCERS

CROSS-REFERENCE TO RELATED APPLICATION

This application claims the benefit of U.S. provisional application entitled "Vertical Comb Drive Transducers and Fabrication Methods," filed Apr. 22, 2020, and assigned Ser. No. 63/013,939, the entire disclosure of which is hereby expressly incorporated by reference.

BACKGROUND OF THE DISCLOSURE

Field of the Disclosure

The disclosure is generally related to electrostatic transducers of micro-electro-mechanical systems (MEMS) devices.

Brief Description of Related Technology

Electrostatic comb-drive transducers provide better linearity and allow higher amplitude of device movement. The movement can be either excited from external force (e.g., acceleration or soundwave) or driven by the electrostatic force of the transducers (e.g., micro mirrors or oscillators). Depending on design, such device movement can be in plane or out of the plane. Therefore, comb drive transducers have been widely used in many MEMS applications such as accelerometers, gyroscopes, and optical mirrors.

For applications such as velocity sensing MEMS microphones and MEMS optical mirrors, out-of-the-plane (vertical) device movement is of special interest. Because vertical comb drive transducers provide the advantage of driving or sensing large amplitudes of motion without collapsing into other structures, vertical comb drive transducers are widely used in the above applications.

Previous efforts of making vertical comb drive transducers are described in U.S. Pat. Nos. 6,744,173, and 7,357,874. Self-aligned, multiple-layer, staggered vertical comb drive transducers that can drive MEMS structures out of the plane are described. With both upward and downward motions of MEMS structures (whether sensing or driving) being useful, symmetrical transducers become warranted. However, the transducers cannot be symmetrical without deforming the MEMS structures, as shown FIG. 3*i* of U.S. Pat. No. 6,744,173.

SUMMARY OF THE DISCLOSURE

In accordance with one aspect of the disclosure, an electrostatic transducer includes a substrate oriented in a plane, a fixed electrode supported by the substrate, and a moveable electrode supported by the substrate, spaced from the fixed electrode in a first direction parallel to the plane, and configured for movement in a second direction transverse to the plane, such that an extent to which the fixed and moveable electrodes overlap changes during the movement. The fixed and moveable electrodes include one or more of a plurality of conductive layers, the plurality of conductive layers including at least three layers. The fixed electrode includes a stacked arrangement of two or more spaced apart conductive layers of the plurality of conductive layers.

In accordance with another aspect of the disclosure, a method of fabricating an electrostatic transducer includes depositing a plurality of conductive layers across a substrate, the plurality of conductive layers including at least three conductive layers, and individually patterning each conductive layer of the plurality of conductive layers to define a fixed electrode of the electrostatic transducer and a moveable electrode of the electrostatic transducer such that the moveable electrode includes at least one of the plurality of conductive layers, and the fixed electrode includes a stacked arrangement of two or more spaced apart conductive layers of the plurality of conductive layers.

In connection with any one of the aforementioned aspects, the devices and/or methods described herein may alternatively or additionally include or involve any combination of one or more of the following aspects or features. The spaced apart conductive layers of the stacked arrangement have at least two different thicknesses. The spaced apart conductive layers of the stacked arrangement have symmetrical thicknesses. The stacked arrangement includes three conductive layers spaced apart from one another. The electrostatic transducer further includes a dielectric layer disposed between adjacent conductive layers of the stacked arrangement. The moveable electrode includes a single conductive layer of the plurality of conductive layers. The moveable electrode includes a first section disposed alongside the fixed electrode and a second section not disposed alongside the fixed electrode. The first and second sections include a different number of the plurality of conductive layers. The first section includes a greater number of the plurality of conductive layers than the second section. The first section includes a lesser number of the plurality of conductive layers than the second section. The moveable electrode includes a single conductive layer of the plurality of conductive layers. The moveable electrode includes multiple conductive layers of the plurality of conductive layers. The multiple conductive layers are spaced apart from one another by a dielectric layer. The multiple conductive layers are stacked in contact with one another. The fixed electrode is one of a plurality of fixed electrodes supported by the substrate. The moveable electrode is one of a plurality of moveable electrodes supported by the substrate. The plurality of fixed electrodes and the plurality of moveable electrodes are disposed in an alternating arrangement. At least one of the plurality of fixed electrodes includes a fixed finger suspended above the substrate. Different voltages are applied to the spaced apart conductive layers of the stacked arrangement. The plurality of conductive layers are etched concurrently such that the plurality of conductive layers are self-aligned. Individually patterning each conductive layer of the plurality of conductive layers includes implementing a deep reactive ion etch from a backside of the substrate. The method further includes depositing dielectric layers before and after depositing one or more conductive layers of the plurality of conductive layers to wrap the one or more conductive layers such that the deep reactive ion etch is configured to maintain a geometry of the one or more conductive layers.

BRIEF DESCRIPTION OF THE DRAWING FIGURES

For a more complete understanding of the disclosure, reference should be made to the following detailed description and accompanying drawing figures, in which like reference numerals identify like elements in the figures.

FIGS. 3A and 3B are schematic, cross-sectional views of an electrostatic transducer having a compliant MEMS structure (e.g., a MEMS microphone) with an overlapping arrangement of moving and fixed electrodes in accordance with another example.

FIGS. 5A and 5B are schematic, cross-sectional views of an electrostatic transducer having a compliant MEMS structure (e.g., a MEMS microphone) with an overlapping arrangement of moving and fixed electrodes in accordance with still another example.

FIGS. 6A and 6B are schematic, cross-sectional views of an electrostatic transducer having a compliant MEMS structure (e.g., a MEMS microphone) with an overlapping arrangement of moving and fixed electrodes in accordance with another example.

FIGS. 7A and 7B are schematic, cross-sectional views of an electrostatic transducer having a compliant MEMS structure (e.g., a MEMS microphone) with an overlapping arrangement of moving and fixed electrodes in accordance with another example.

Figure 1A:
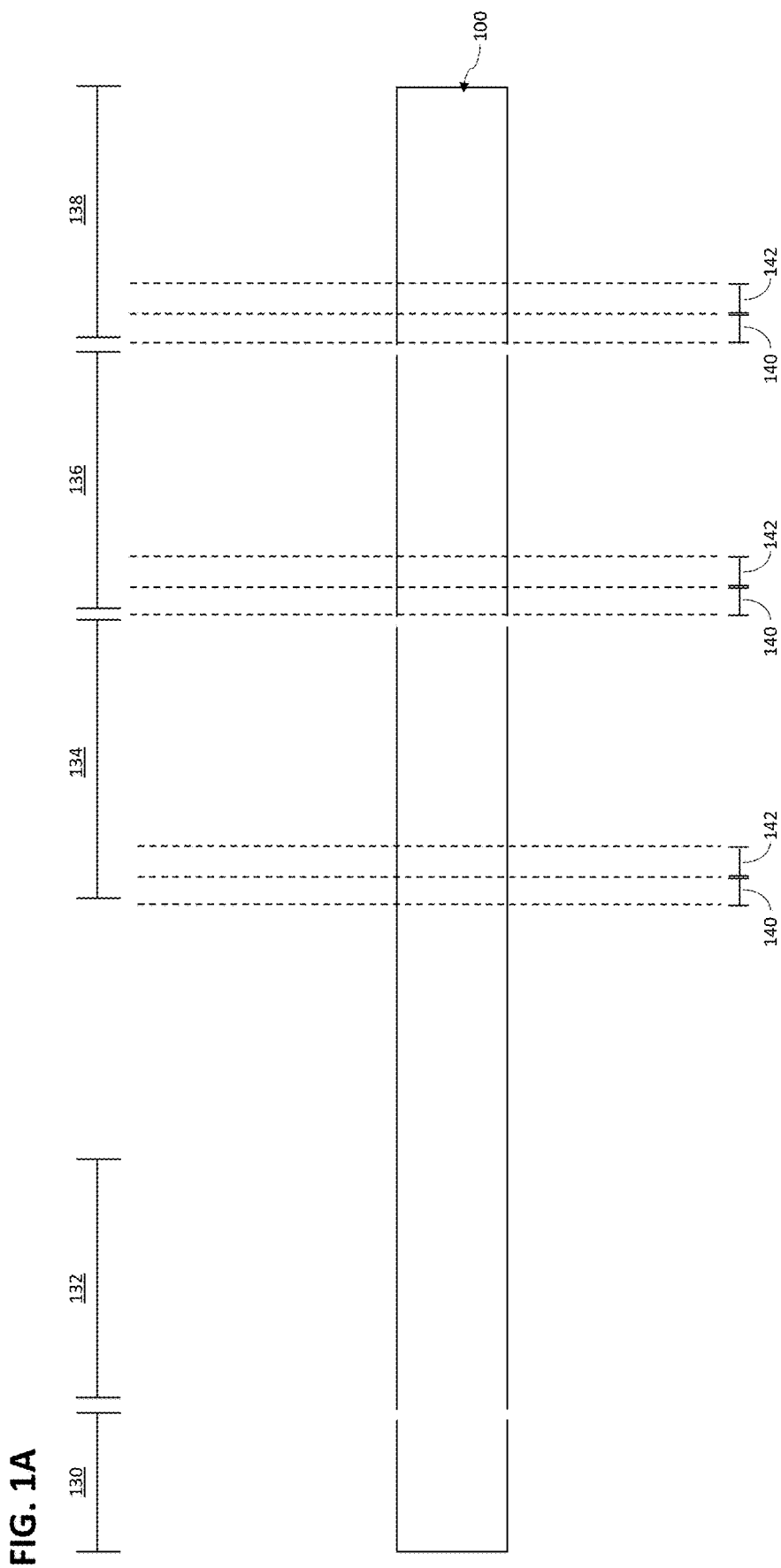
FIGS. 1A-1S are schematic, cross-sectional views of a process flow and method for fabricating or making electrostatic transducers (e.g., vertical comb drives) in accordance with one example.

The embodiments of the disclosed devices and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Electrostatic MEMS transducers having one or more electrodes with multiple layers are described. Moveable and/or fixed electrodes of the MEMS transducers may have a multiple layer configuration or construction. The moveable electrode(s) of the disclosed transducers may be configured for movement (e.g., vertical movement) alongside the fixed electrode(s). A change in the extent to which the moveable and fixed electrodes overlap is detected. The ability to include multiple layers (e.g., multiple layers of varying thicknesses) provides for a greater and more effective amount of overlap.

Methods of fabricating such transducers are also described. The disclosed methods include the deposition of at least three conductive (e.g., polysilicon) layers. The bottom or innermost polysilicon layer may be patterned and etched together with a back side deep reactive ion etch process, while maintaining the geometry of the first or topmost layer. The fabrication method allows the fixed and moveable electrodes to be formed from any combination of the three conductive layers (e.g., poly layer 1 for the moveable electrode vs. poly 1 and poly 2 for the fixed electrode; poly 3 vs. poly 2 and poly 3; poly1 and poly 2 vs. poly 3, etc.). In this manner, the method may be configured to create a useful electrostatic transduction scenario for various applications. The multiple (e.g., three or more) layers of polysilicon (as well as any intervening dielectric layers) may be etched concurrently (e.g., at the same time with a common, single mask) so that they are self-aligned. This process provides a way of combining the multiple layers of polysilicon as proof mass for various applications. For instance, removal via etching of an intervening dielectric layer allows the adjacent polysilicon or other conductive layers to be combined. The resulting thicker, composite polysilicon layer may be a proof mass, e.g., for accelerometers.

In some cases, the disclosed MEMS transducers include multiple fixed electrodes and/or multiple moveable electrodes. The multiple electrodes may be disposed in a comb or other alternating arrangement.

The disclosed transducers may be configured as vertical comb-drive transducers. Vertical comb-drive transducers may be useful in applications that involve large amplitude of movement. However, for comb-drive transducers with a single polysilicon layer, the device performance is limited. With the multiple layers of polysilicon for both fixed and moving electrodes, different bias voltages may be applied to different conductive layers. In this way, the electric field between the moving and fixed electrodes may be changed such that device performance for specific applications may be enhanced.

In one aspect of the disclosure, the disclosed devices and methods provide vertical electrostatic MEMS transducers with symmetric electrodes. With a symmetrical electrode configuration, the transducers provide high linearity, high dynamic range, and minimum position offset. Moreover, with the flexibility of choosing layer combinations of both moving and static electrodes, more electrostatic sensing techniques, such as controllable electrical stiffness, can be applied to maximize the performance of MEMS devices.

Although described below in connection with microphone applications, the disclosed devices are useful in a wide variety of contexts. For instance, the applications of the disclosed devices include, but are not limited to, MEMS microphones, MEMS speakers, tunable MEMS mirrors for optical communications or LIDAR, accelerometers, and gyroscopes.

MEMS sensors include a mechanical moving element that responds to some environmental stimulus as well as a transduction method to convert the motion of that moving element into an electrical signal. One example is a MEMS microphone. MEMS microphones include a transducer that moves in response to an incoming acoustic wave. In some cases, capacitive sensing is used to convert the transducer motion into an electrical signal. In order to improve the sensitivity of the microphone, the mechanical transducer can be made very compliant, so that small changes in acoustic stimulus lead to meaningful changes in transducer motion. However, the audible range of sounds encompasses a broad band of wavelengths and levels of sound. Thus, at low frequencies and/or high sound pressure levels, the displacement of air due to a propagating sound wave can be very large. This leads to large transducer motion, if made compliant, which can lead to a nonlinear response in the electrical readout. Such non-linearity, in turn, undesirably leads to increased total harmonic distortion and a reduced acoustic overload point.

Figure 1B:
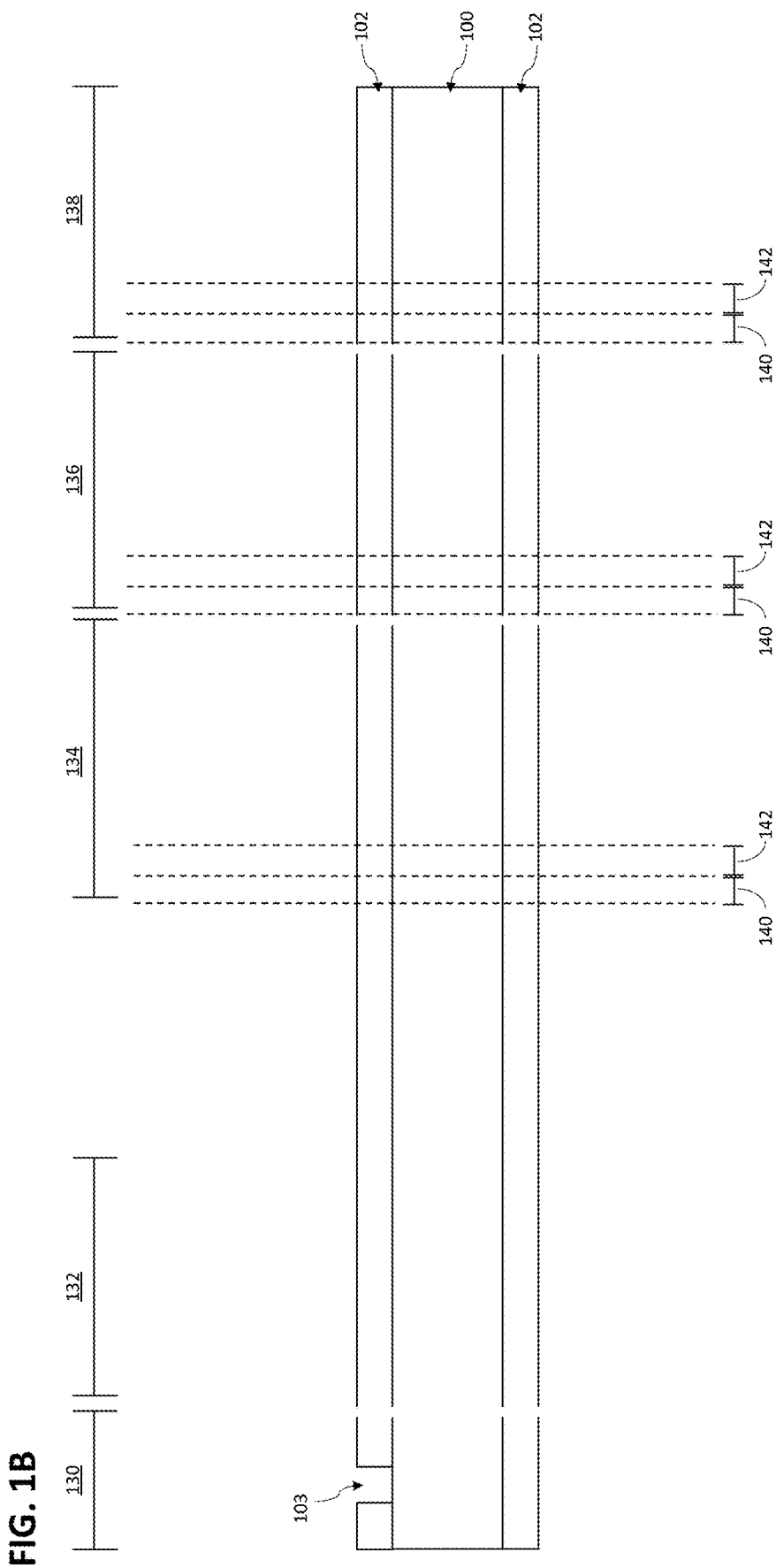
Figure 1C:
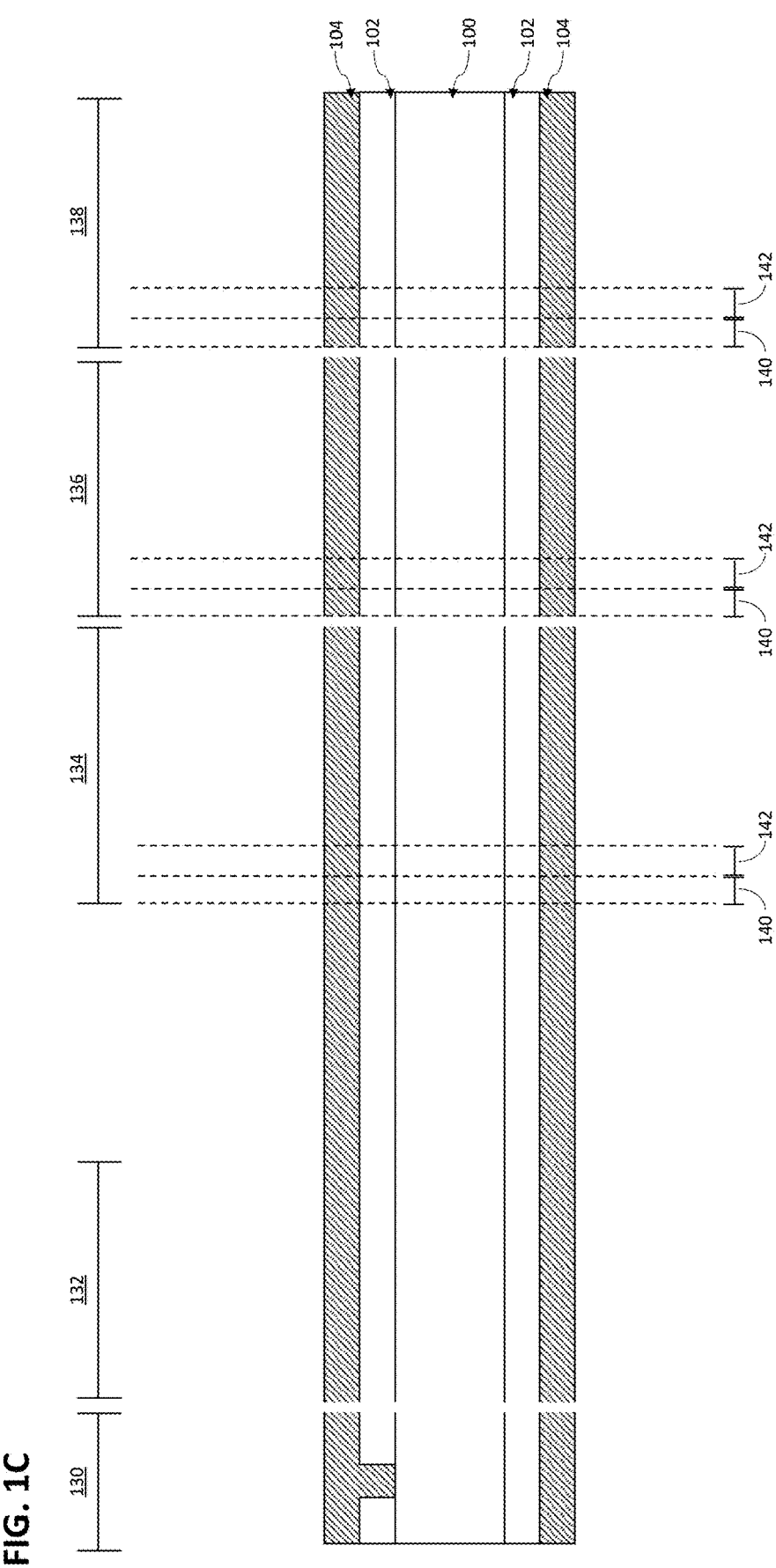
Figure 1D:
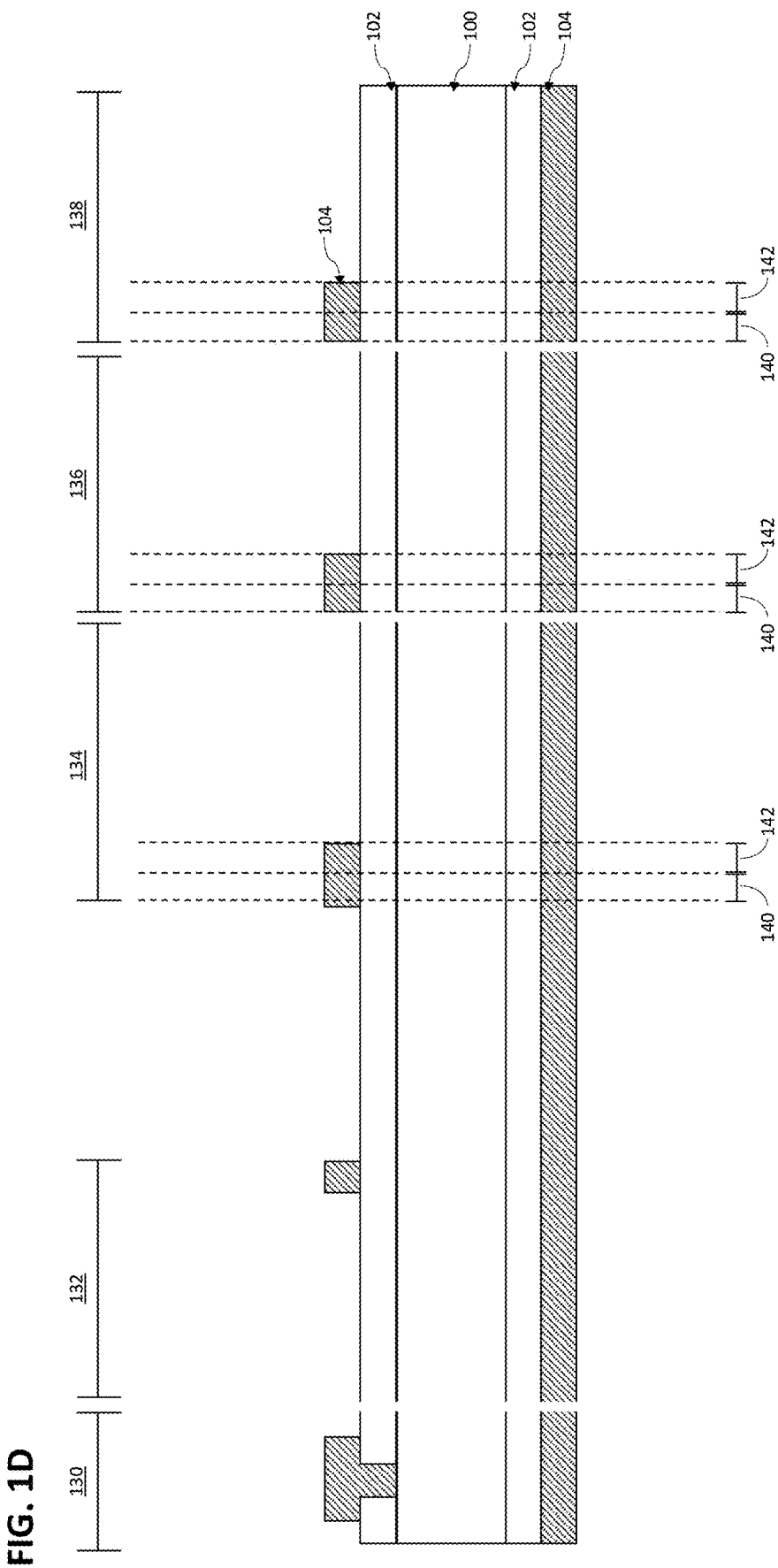
Figure 1E:
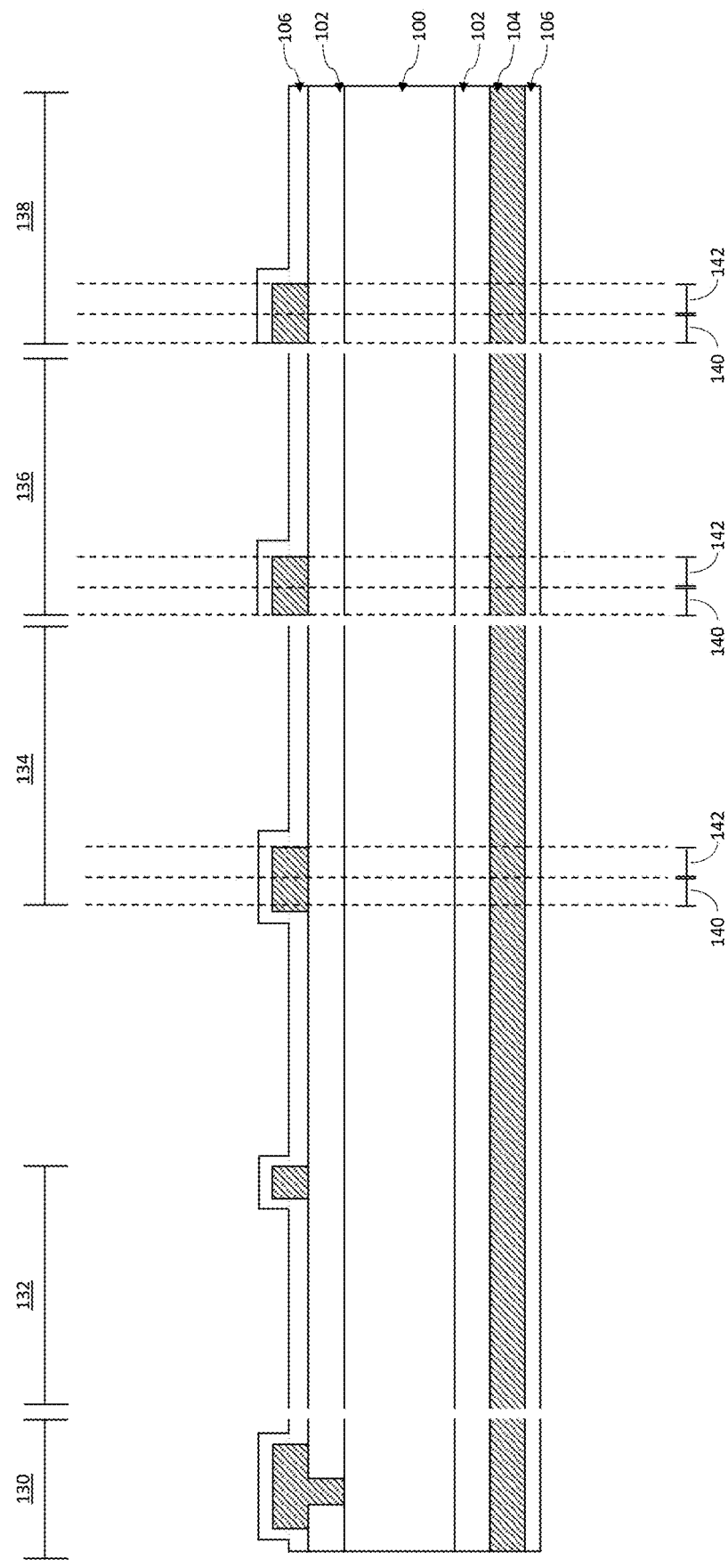
Figure 1F:
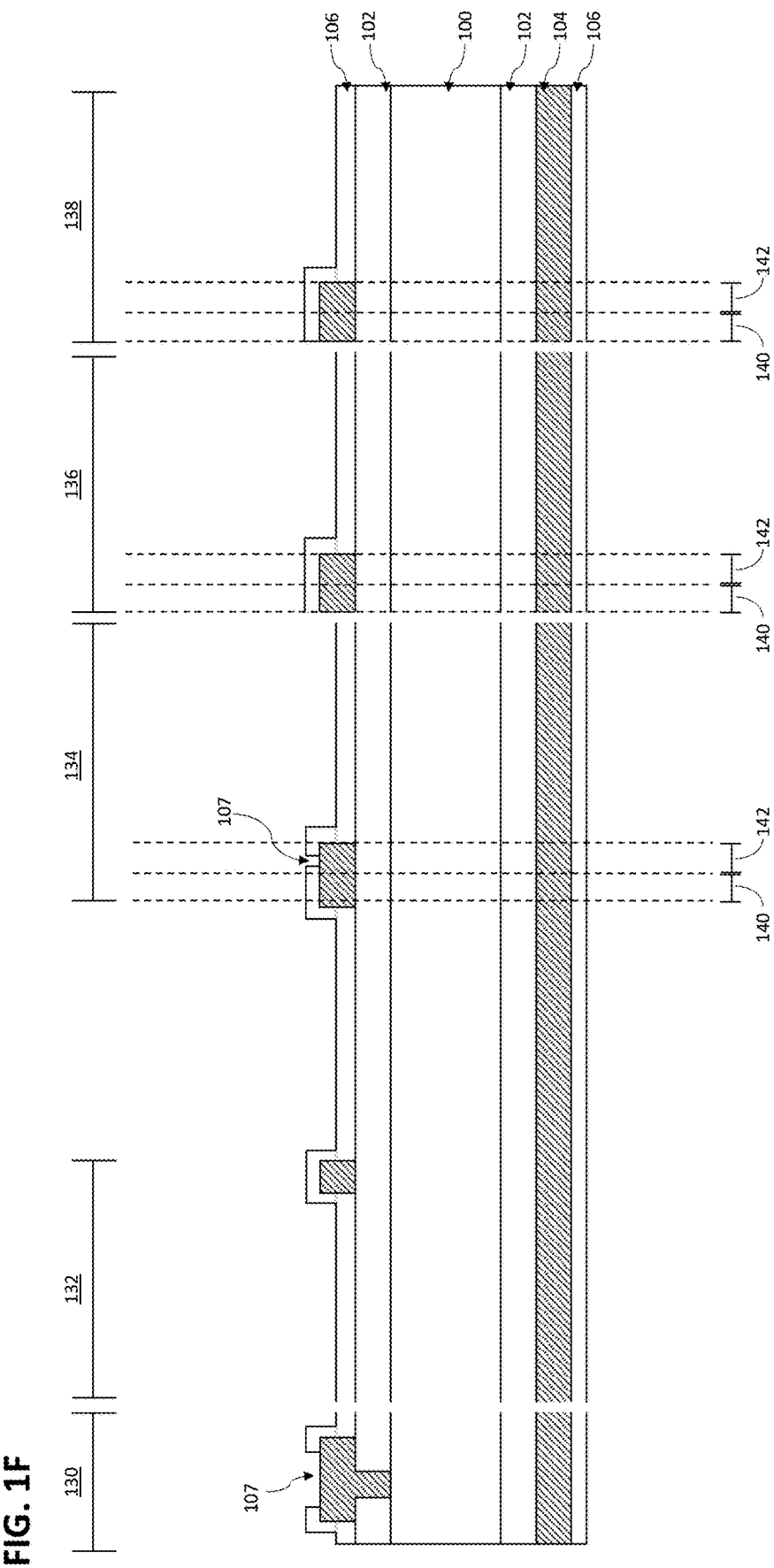
Figure 1G:
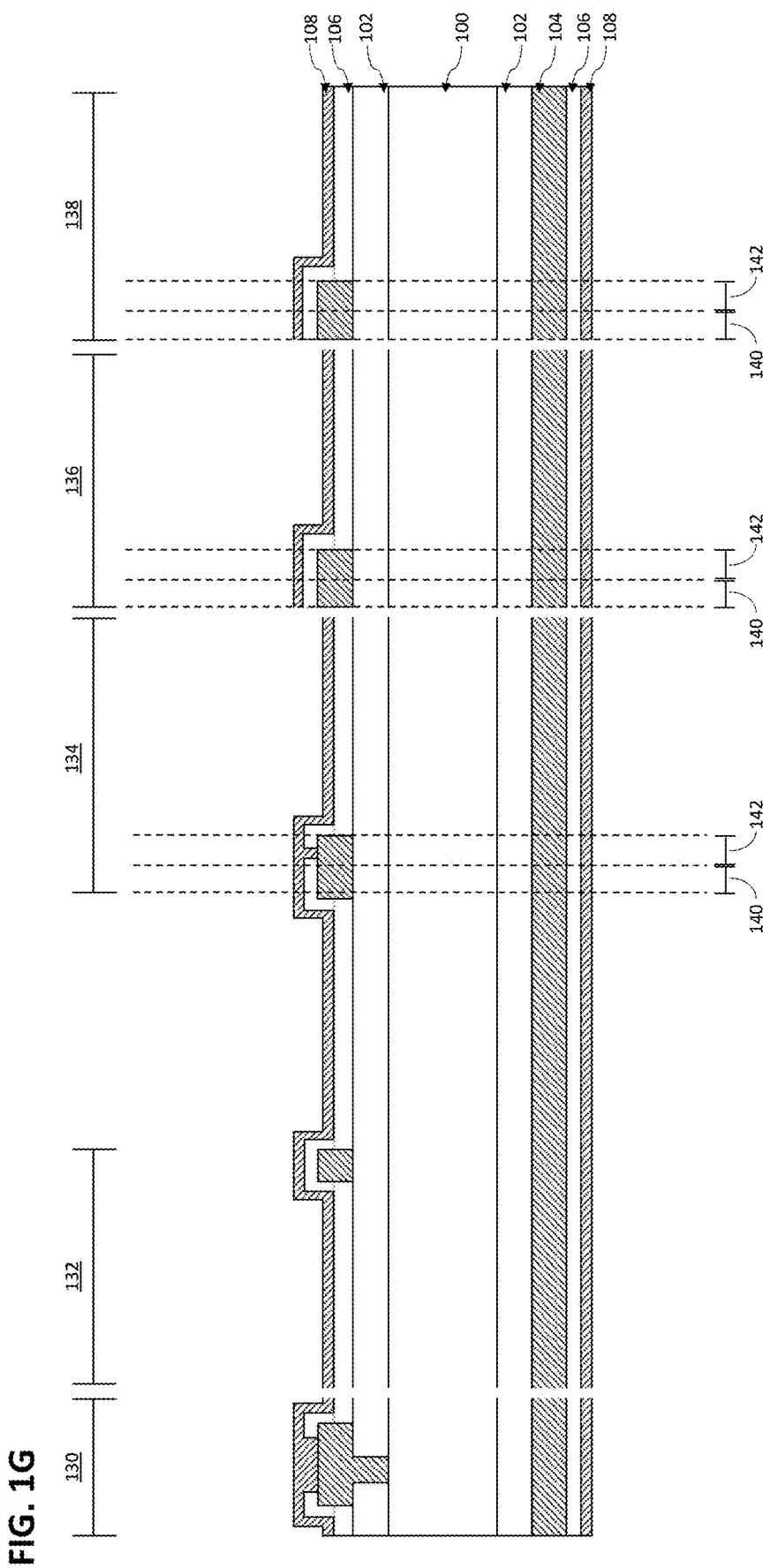
Figure 1I:
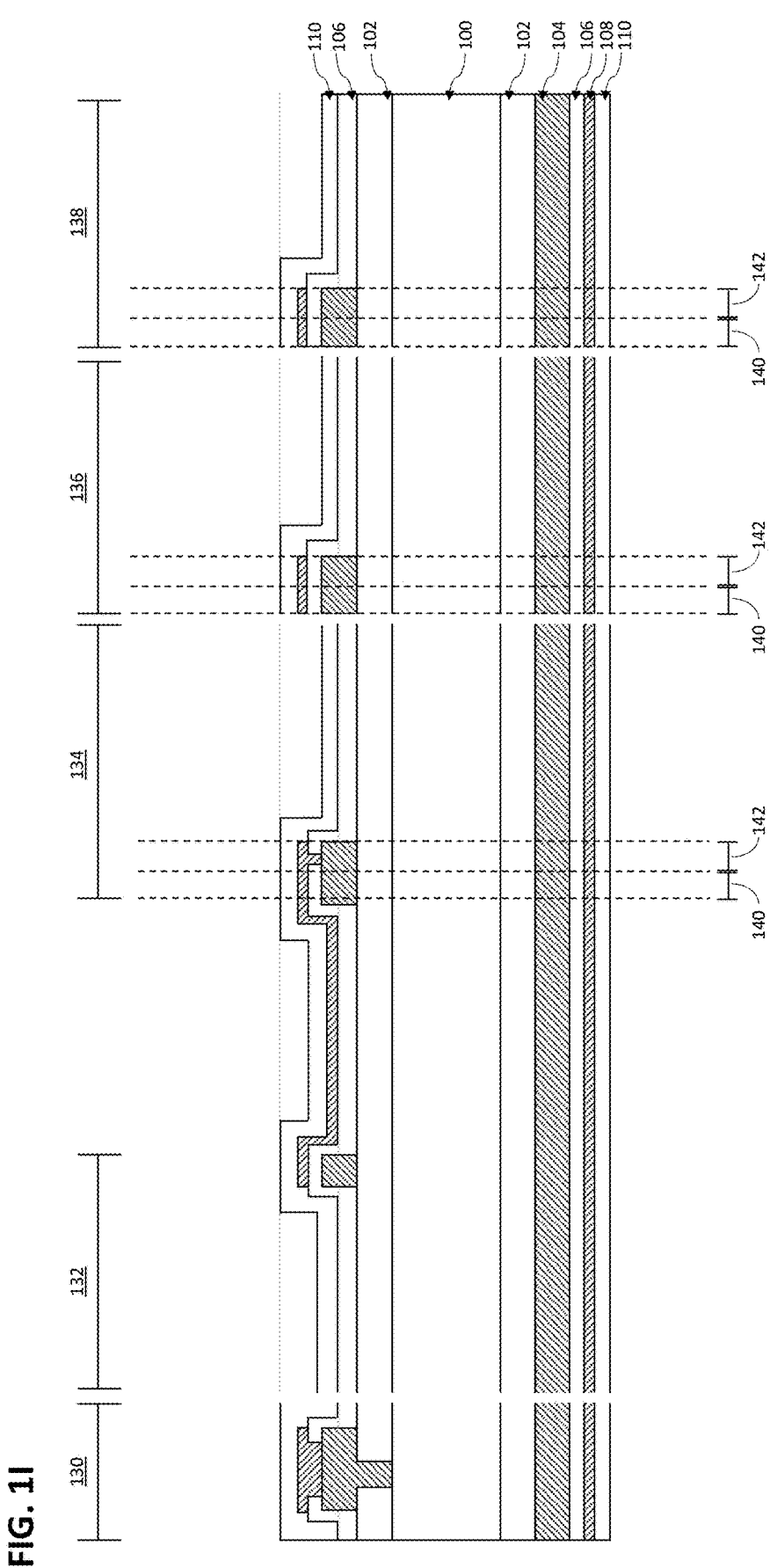
Figure 1J:
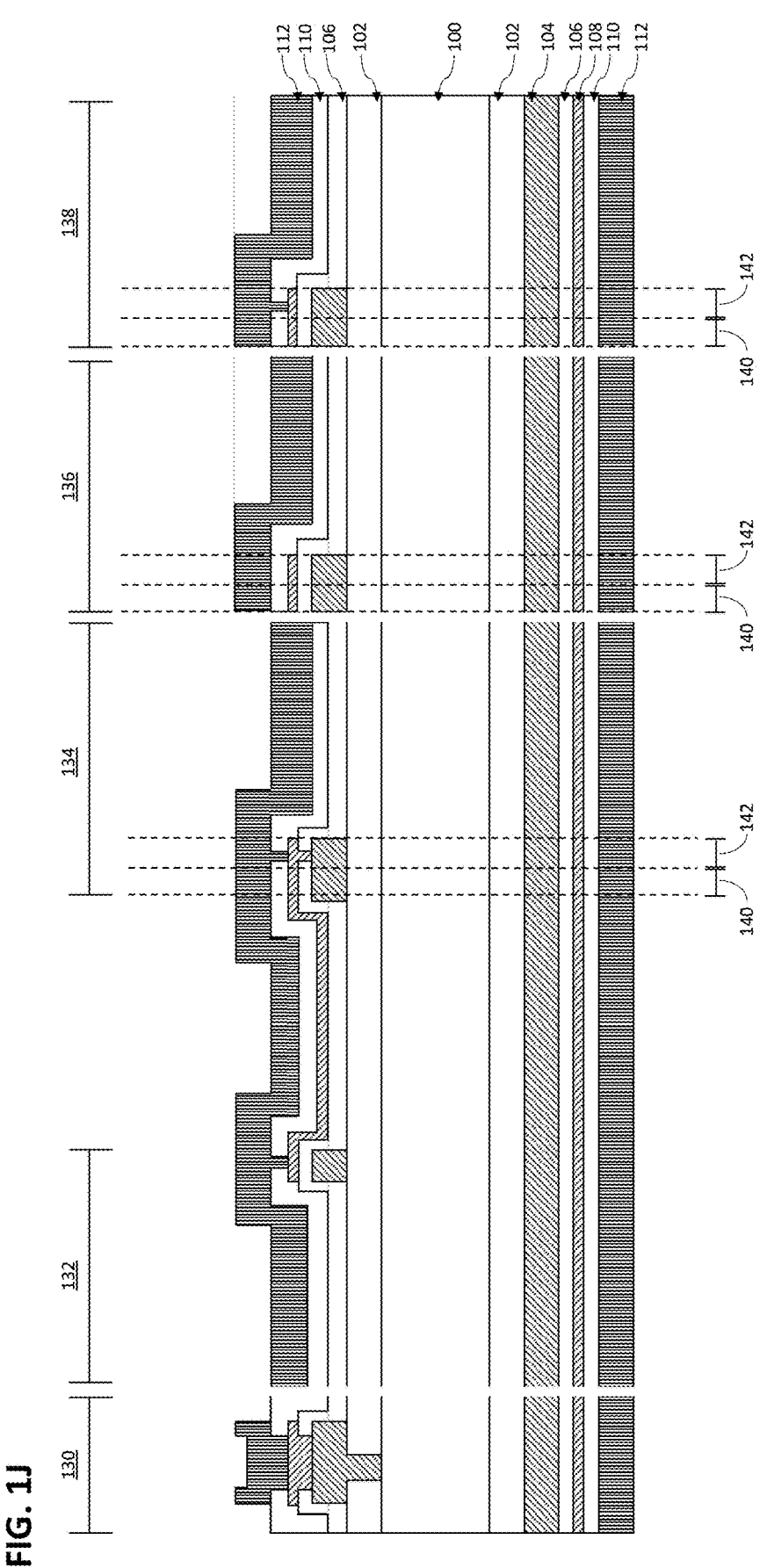
Figure 1K:
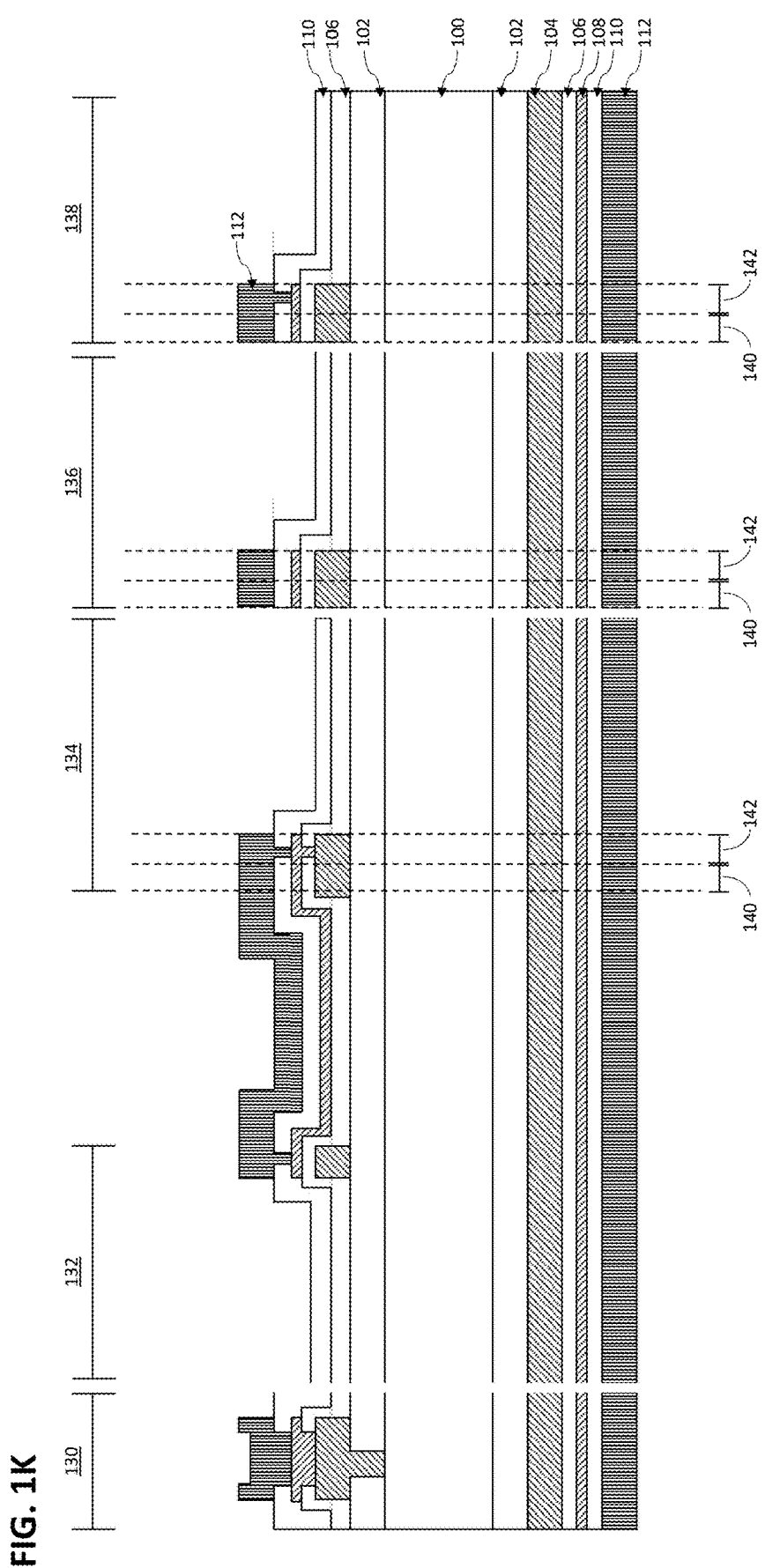
Figure 1L:
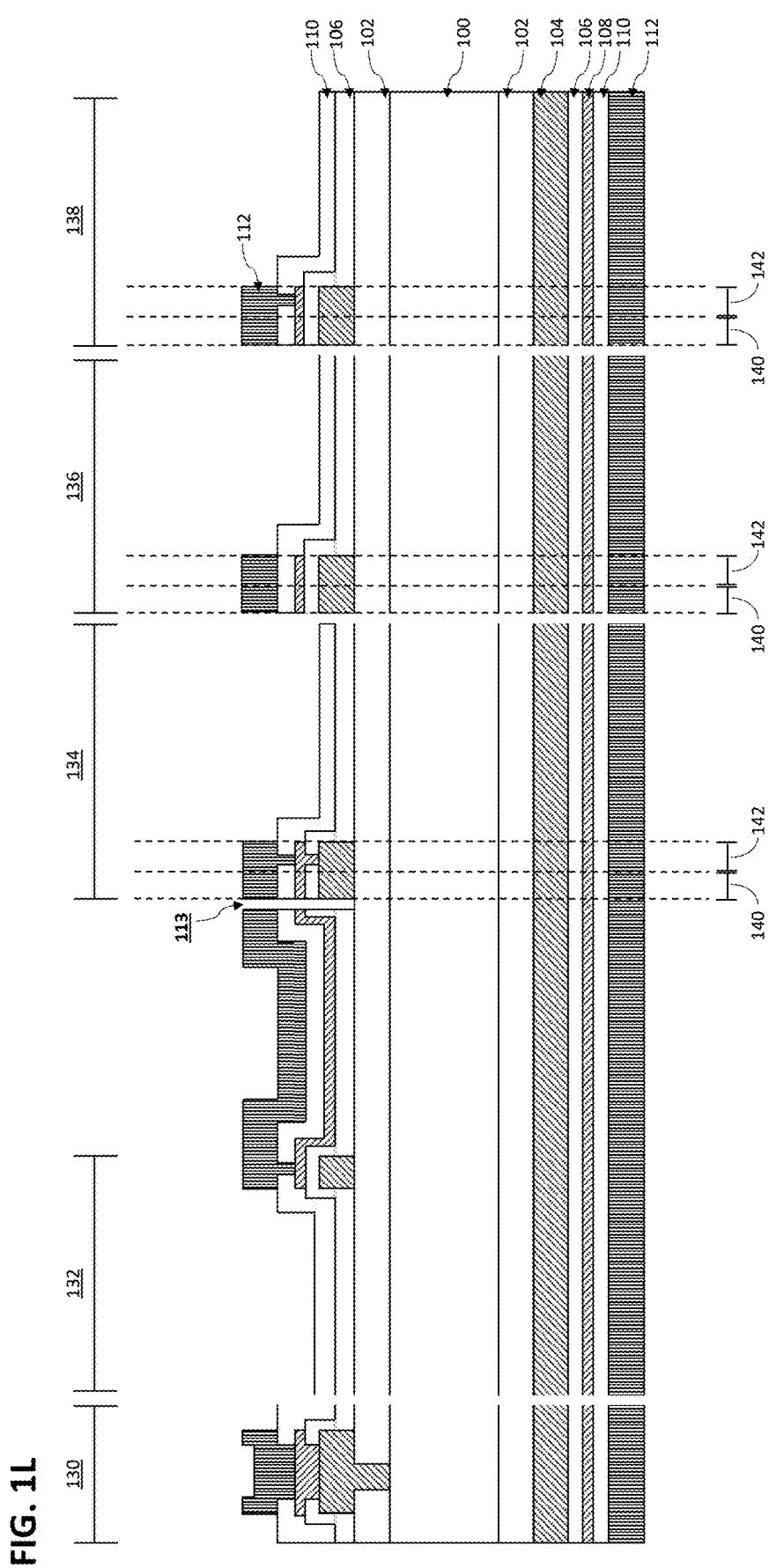
Figure 1M:
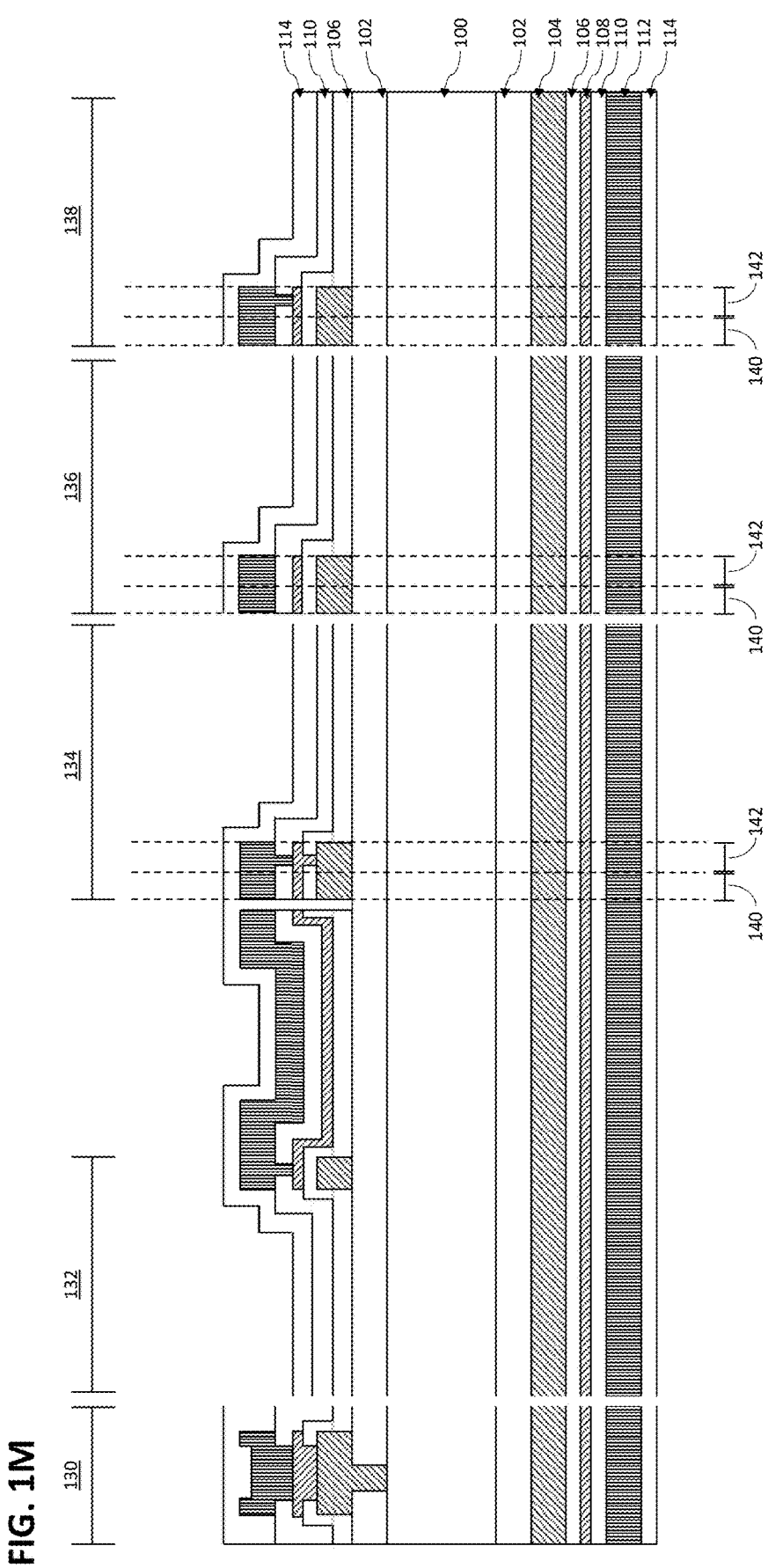
Figure 1N:
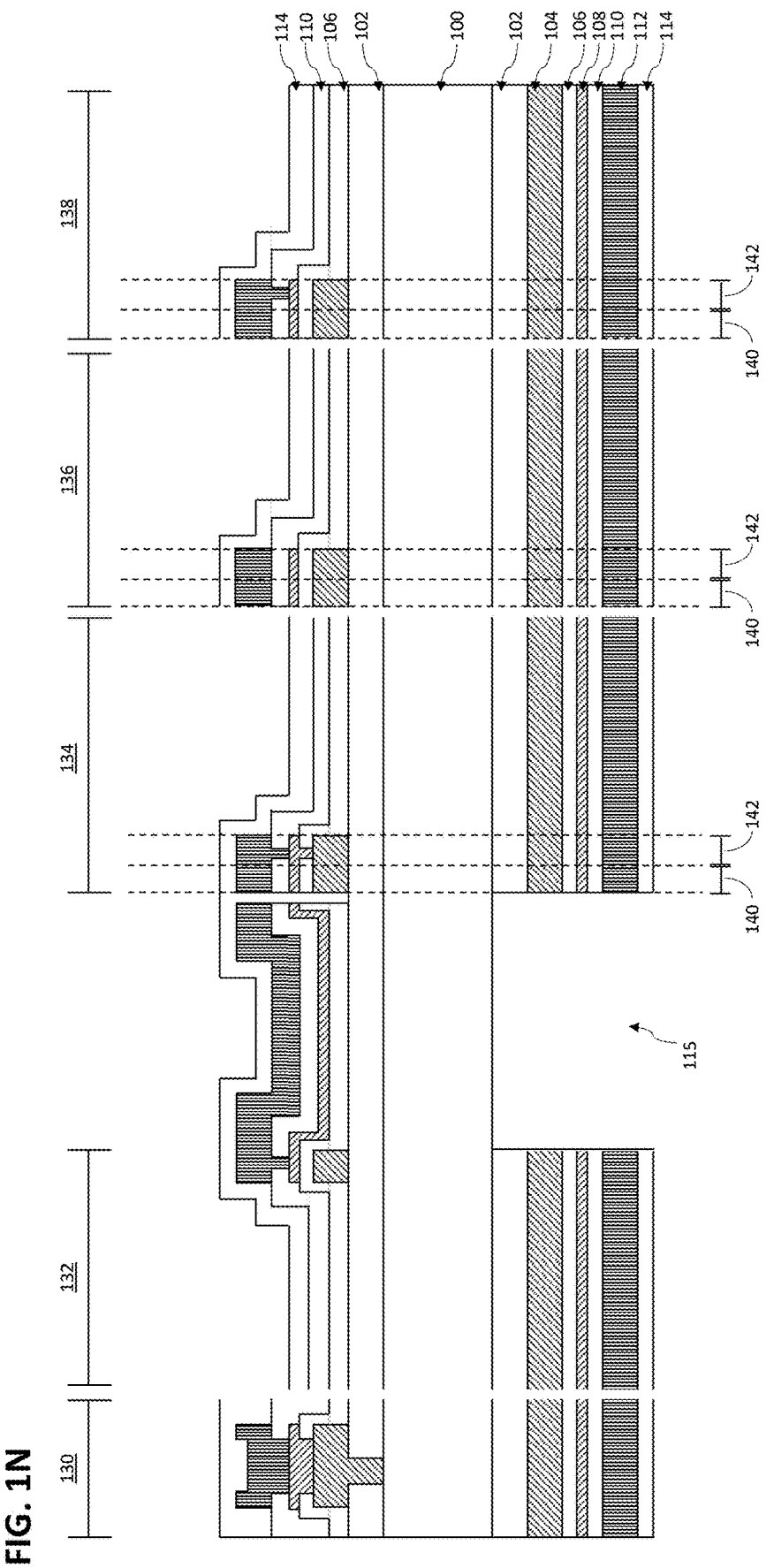
Figure 10:
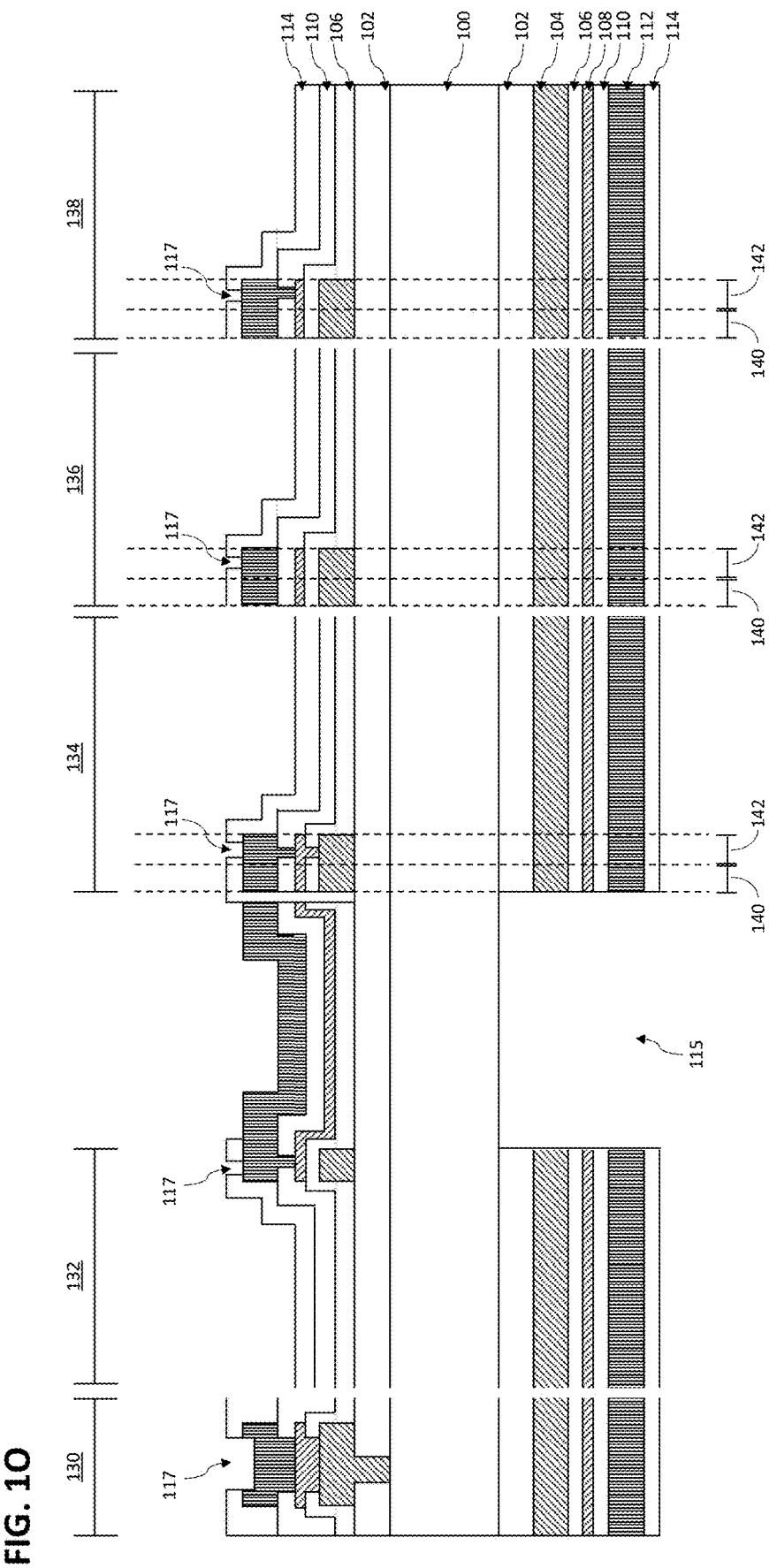
Figure 1P:
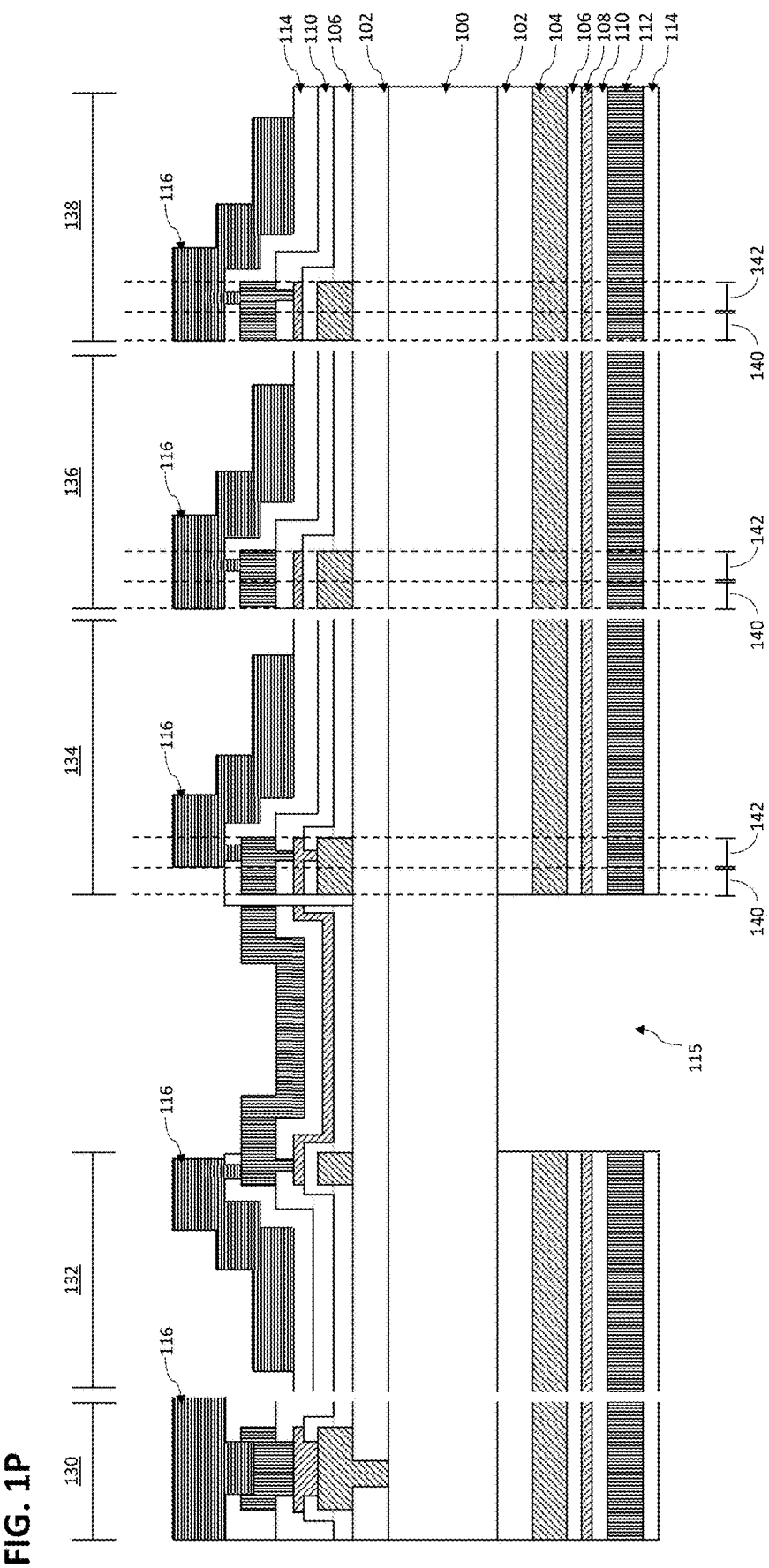
Figure 1R:
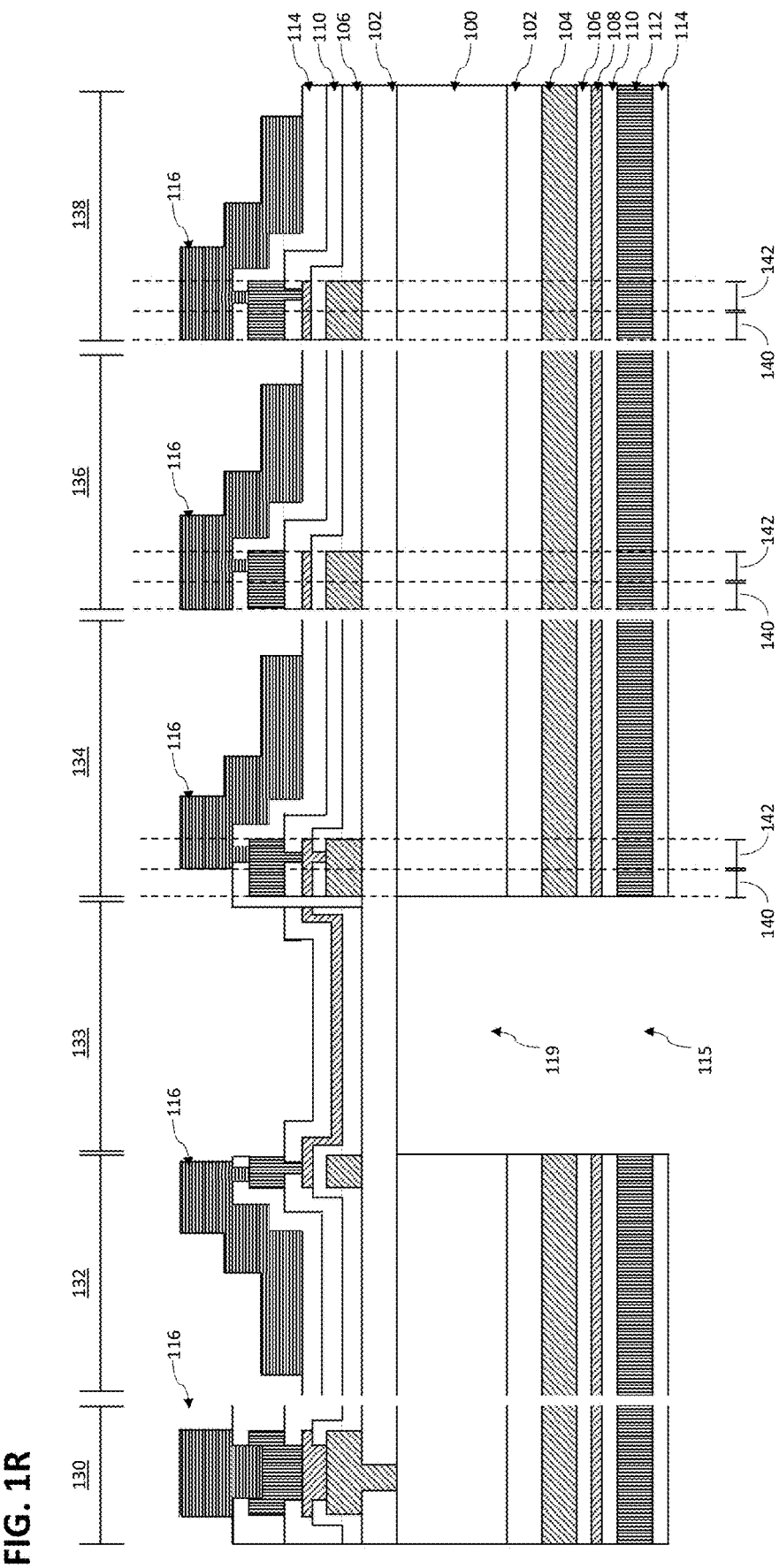
Figure 1S:
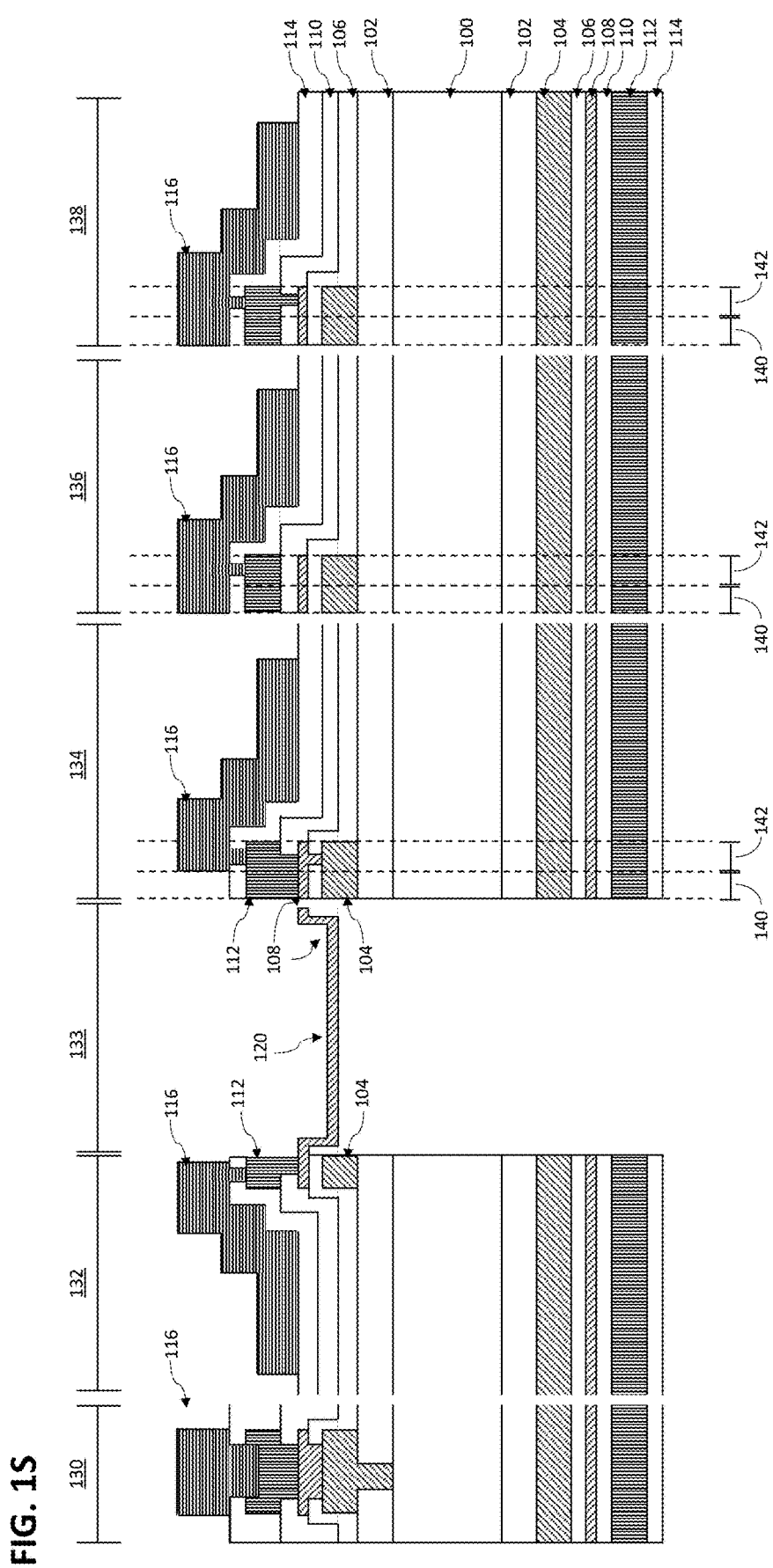

FIGS. 1A-1S depict a method or process flow for fabricating or making a vertical comb drive electrostatic transducer or other device (e.g., MEMS device) in accordance with one example. By combining different layers together, a variety of electrode configurations with different thickness may be realized, such that the electrodes have different amounts of overlap for different applications. A variety of electrode configurations are described hereinbelow. The cross sectional schematics depicted in FIGS. 1A-1S show several regions of a vertical comb drive electrostatic transducer with three conductive electrode layers. In some examples, the conductive electrode layers may be composed of, or otherwise include, polysilicon. The material stack of the transducer may be constructed such that electrical contact may be made through the top most layer to various electrical nodes buried in the transducer's material stack. Region 130 depicts an area where electrical contact to the substrate of the transducer is exposed. Region 134 corresponds with an area where electrical contact to a first electrode of the transducer is exposed. Region 132 corresponds with an area where electrical contact to a second electrode of the transducer is exposed. Region 136 corresponds with an area where electrical contact to a fourth electrode of the transducer is exposed. Region 138 corresponds with an area where electrical contact to a fourth electrode of the transducer is exposed. In some examples, the second electrode and fourth electrode of the transducer may be constructed from the same conductive layer during the deposition or other fabrication process.

The vertical comb drive electrostatic transducer includes at least one moving electrode and at least one fixed electrode. In some examples, the fixed electrode may include multiple (e.g., two) regions. Region 140 corresponds with a location of a fixed finger. During the manufacturing process, the fixed finger region 140 may be etched such that a bulk substrate 100 is removed and the fixed finger is suspended over an open cavity. Region 142 corresponds with a location of a fixed anchor, which may couple the fixed finger to the substrate 100. By etching away the substrate 100 under the finger region 140, the parasitic capacitance between the fixed electrode and the substrate 100 may be reduced.

In FIGS. 1A-1S, there are a number of gaps between the above-referenced regions 130, 132, 136, 138. The gaps are depicted to indicate that different areas of the device have a different cross section. So the cross-sectional view includes sections of different portions of the device. The gaps show where the position of the sectional cut changes.

FIG. 1A depicts the substrate 100 before the formation of the fixed finger and fixed anchor. The substrate may be composed of, or otherwise include, silicon. Additional or alternative materials, e.g., semiconductor materials, may be used.

As shown in FIG. 1B, a first oxide layer 102 (e.g., silicon dioxide) is deposited on the substrate 100. The first oxide layer 102 is then patterned and etched such that an area 103 to the substrate layer 100 in the region 130 is exposed. The first oxide layer 102 may serve as an etch stop for an etching process. The first oxide layer 102 may also define and protect static or dynamic comb fingers during a deep reactive ion etching (DRIE) process in one or more later steps.

In FIG. 1C, a first polysilicon layer 104 is deposited on the oxide layer 102. The first polysilicon layer 104 may define a first electrode of the transducer in the region 134. In the region 130, the polysilicon layer 104 fills the area 103 and forms a connection with the substrate layer 100.

In FIG. 1D, the first polysilicon layer 104 is patterned and etched.

In FIG. 1E, a second oxide layer 106 (e.g., silicon dioxide) is deposited on top of the first polysilicon layer 104.

In FIG. 1F, the second oxide layer 106 is patterned and etched to expose the first polysilicon layer 104 in areas 107.

In FIG. 1G, a second polysilicon layer 108 is deposited on the second oxide layer 106. The second polysilicon layer 108 may define a second electrode of the transducer in the region 132 and a fourth electrode of the transducer in the region 138. In the regions 130 and 134, the polysilicon layer 108 may fill the areas 107 such that the polysilicon layer 108 forms a connection with the first polysilicon layer 104 in the region 130 and the region 134.

In FIG. 1H, the second polysilicon layer 108 is patterned and etched to form one or more desired mechanical structures for the MEMS device.

In FIG. 1I, a third oxide layer 110 is deposited on top of the second polysilicon layer 108.

In FIG. 1J, the third oxide layer 110 is patterned and etched to create openings to the second polysilicon layer 108 in the regions 130, 134, and 138. A third polysilicon layer 112 is deposited on the third oxide layer 110. The third polysilicon layer 112 may define a third electrode of the transducer in the region 132 and the fourth electrode of the transducer in the region 136. In the regions 130, 134, and 138, the third polysilicon layer 112 may fill the openings such that the third polysilicon layer 112 forms a connection with the second polysilicon layer 108.

In FIG. 1K, the third polysilicon layer 112 is patterned and etched.

In FIG. 1L, comb fingers as well as other MEMS structures are defined by etching through the stack of films or layers that include the first polysilicon layer 104, the second oxide layer 106, the second polysilicon layer 108, the third oxide layer 110, and the third polysilicon layer 112 to create a trench 113.

In FIG. 1M, a fourth oxide layer 114 is deposited on top of the third polysilicon layer 112. The sidewall of comb fingers and other desired structures in the material stack are protected by conformal deposition of the oxide 114 into the trench 113.

In FIG. 1N, a deep reactive ion etching (DRIE) pattern on the backside of the wafer is defined and the stack of the films or layers 102, 104, 106, 108, 110, 112, and 114 are etched in an area 115 to expose the silicon substrate 100.

In FIG. 1O, the fourth oxide layer 114 is patterned and etched to expose the third polysilicon layer 112 in the regions 130, 132, 134, and 136. The patterning may be for metal pads and any other MEMS areas in which the third layer of polysilicon 112 is not warranted or otherwise used.

In FIG. 1P, lithography is conducted to define metal pads 116 and protect the third polysilicon layer 112 from contacting metal. Then one or more metal layers are deposited and lifted off to form the metal pads 116.

After metal lift-off, undesired portions of the polysilicon layer 112 are etched away as shown in FIG. 1Q.

In FIG. 1R, DRIE is conducted from the backside in an area 119 through the silicon substrate 100. The desired polysilicon structure in the region 133 is protected from DRIE by the first oxide layer 102 and the fourth oxide layer 114.

In FIG. 1S, a MEMS structure 120 in the region 133 is released. The regions 132, 133, and 134 may define a MEMS transducer containing the MEMS structure 120. The MEMS transducer is configured such that the MEMS structure 120 moves relative to the fixed fingers in the region 140 when subject to an external stimulus. The regions 130, 136, 138 may be oriented or disposed in other locations on the MEMS device, and may be configured to establish or otherwise provide an electrical connection to the various electrode layers in the MEMS transducer. The MEMS structure 120 forms a first capacitance with the fixed electrode layer 104 in the region 134, a second capacitance with the fixed electrode layer 108 in the region 134, and a third capacitance with the fixed electrode layer 112 in the region 134. At least one bias voltage may be placed on any one or more of the fixed electrode layers. In some examples, the MEMS structure 120 is established by, or otherwise includes, only a single polysilicon layer, e.g., the polysilicon layer 108. In other examples, the MEMS structure 120 may include any combination of the layers 102, 104, 106, 108, 110, 112, and/or 114. For example, additional layers may be included in the MEMS structure 120 to increase the thickness of the vertical comb drive.

The above-described fabrication process has several useful aspects. For instance, in one aspect, the process builds self-aligned, three-layer vertical comb drive electrodes for MEMS devices with fine features. In another aspect, fine features of bottom electrodes (Poly1) are pre-defined (e.g., see FIG. 1G) and protected from deep reactive ion etching from the backside by one or more oxide layers (e.g., the first and the fourth oxide layers). In another aspect, the first polysilicon layer is removed from one or more areas in which the polysilicon layer is not warranted (e.g., by DRIE) without damaging fine features of the desired structure provided by the first polysilicon layer. These and other aspects of the disclosed methods and devices were not achieved in the above-referenced prior art.

Although the materials used in the above-described example of the process flow are polysilicon and oxide, any combination of conductive materials and dielectric layers may be used. For instance, examples of alternative or additional materials include monocrystalline silicon/oxide, metal/polyimide, metal/oxide, and metal/nitride, but still other materials may be used.

For a typical MEMS microphone, acoustic energy enters the sound port of an assembly and vibrates a diaphragm, creating a change in electric potential between the diaphragm and a fixed backplate, forming a parallel plate electrostatic transducer. The electrostatic force on the moving diaphragm is typically related to the square of the gap between the diaphragm and the fixed backplate. For small gaps where the electrostatic force is nonnegligible relative to the excitation force of the acoustic stimulus and other inherent mechanical forces of the diaphragm, the response of the transducer is thus nonlinear.

In order to avoid these nonlinear effects, a capacitive sensing scheme may be configured with vertical comb drive transducers.

Described hereinbelow are a number of examples of electrostatic transducers that may be fabricated via the above-described method, and/or another method. Each of the electrostatic transducers includes fixed and moveable electrode formed via the patterning of a stack of conductive layers (e.g., polysilicon layers). In some cases, adjacent conductive layers in the stack may be spaced apart from one another. The spacing may be provided by a dielectric layer, such as a silicon dioxide layer.

The fixed and moveable electrodes may be spaced apart from one another in a direction (e.g., a lateral direction) parallel to a plane in which a substrate supporting the electrodes is oriented. The moveable electrode may be configured for movement in a direction transverse to the substrate plane such that an extent of an overlap (e.g., a vertical overlap) between the fixed and moveable electrodes changes during the movement.

Figure 2B:
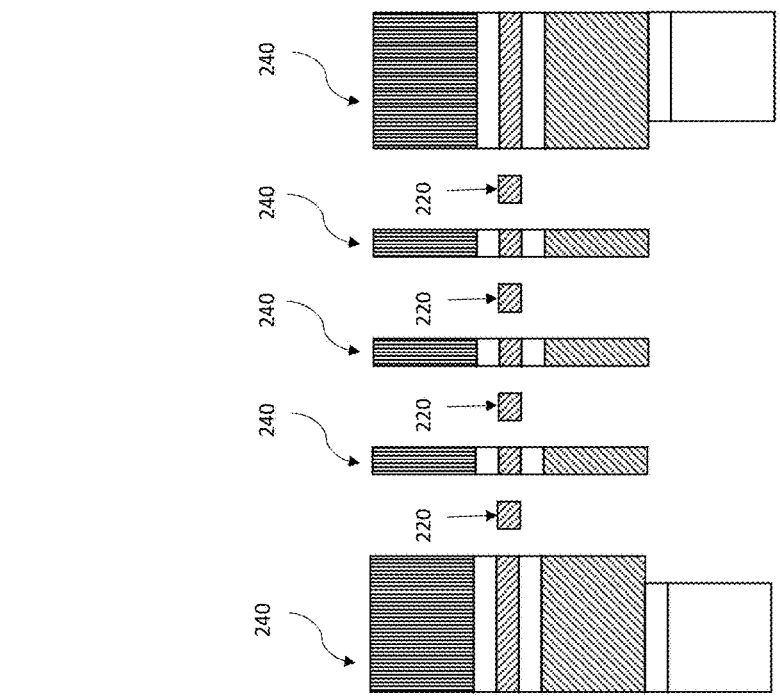
FIGS. 2A and 2B are schematic, cross-sectional views of an electrostatic transducer having a compliant MEMS structure (e.g., a MEMS microphone) with an overlapping arrangement of moving and fixed electrodes in accordance with one example.
Figure 2A:
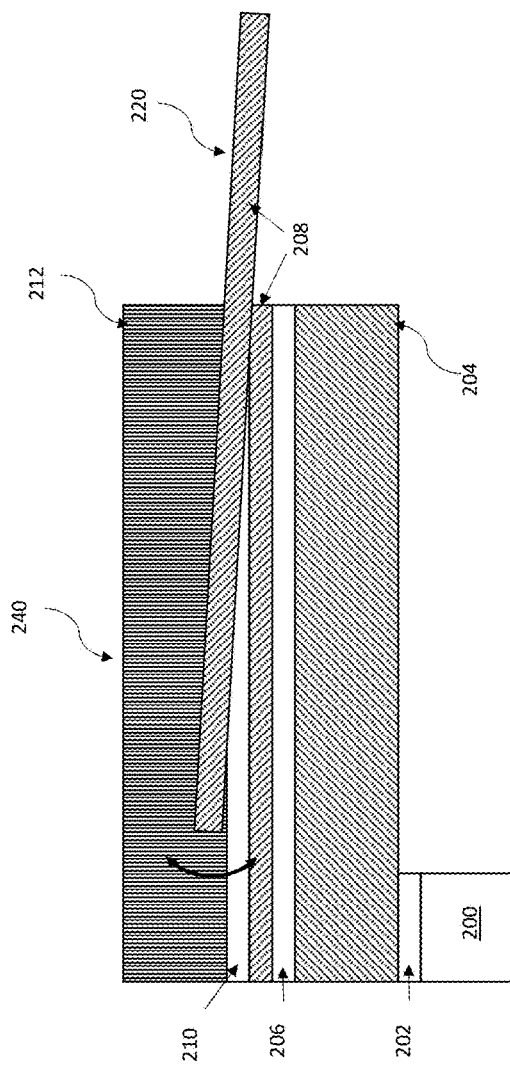

FIG. 2A schematically shows a cross section of an electrostatic transducer (e.g., a vertical comb drive transducer) in accordance with one example. The transducer includes a moving structure, or electrode, 220 and a fixed electrode, or finger, 240. The fixed finger 240 contains a first electrode (or electrode layer) 204, a second electrode (or electrode layer) 208, and a third electrode (or electrode layer) 212 separated by insulating layers 206 and 210. Each one of the electrodes may thus correspond with, and be formed by a respective layer (e.g., polysilicon layer).

The fixed electrodes 204, 208, and 212 are mounted to, or otherwise disposed on or supported by, a substrate 200 through or via insulating layer 202. In some cases, the substrate 200 may be composed of, or otherwise include, silicon.

The insulating layers 202, 206, and 210 may be composed of, or otherwise include, an oxide (e.g., silicon dioxide) and/or a nitride layer (e.g., silicon nitride). The electrode layers 204, 206, and 208 may be composed of, or otherwise include, polysilicon.

The moving electrode 220 moves relative to the fixed finger 240 in a direction parallel to the axis on which the electrodes 204, 206, and 208 lay. For instance, the movement may be in a direction parallel to the direction in which the electrode layers are stacked. The movement direction may thus be disposed in a plane transverse to the planes in which the electrode layers are oriented.

The moving electrode 220 may be formed by, or correspond with, a portion of the polysilicon layer 208. The moving electrode 220 creates a first capacitance with the electrode layer 204 of the fixed finger 240 and a second capacitance with the electrode layer 212 of the fixed finger 240. As the moving finger 220 vibrates, the extent or amount of an overlap between the moving electrode 220 and the fixed electrode layers 204 and 212 of the fixed finger 240 changes. Consequently, the first and second capacitances change relative to one another. Charge is thus unevenly distributed across the fixed electrode layers 204 and 212 of the fixed finger 240. By measuring the change in charge between the electrode layers 204 and 212 of the fixed finger 240, the mechanical motion of the moving electrode 220 can be converted into an electrical signal. In this configuration, the change in electrical charge between a pair of electrodes is based on a change in the extent of the overlap instead of a change in gap between the two electrodes. Thus, the electrical force on the MEMS transducer 220 is reduced as the moving electrode is displaced. This aspect of the transducer holds true as long as there is sufficient overlap between the moving electrode 220 and the electrode layers 204 and 212 as the transducer 220 is displaced.

FIG. 2B depicts another cross section of the vertical comb drive transducer shown in FIG. 2A to depict an interdigitated nature of the moving electrodes 220 and the fixed fingers 240. The transducer may include a plurality of fixed fingers 240 and a plurality of moving electrodes 220. In some cases, some of the fixed fingers 240 may be constructed such that the substrate 200 underneath the fixed fingers 240 is removed such that some of the fixed fingers 220 are suspended as shown.

The thickness of the MEMS structure may be small in the interest of establishing a MEMS structure that is compliant and responds well to incoming stimulus. For instance, the second polysilicon layer 108 (depicted as layer 208 in FIG. 2A) may be a thin polysilicon layer, as described herein to respond to the stimulus. The sensitivity improves as the thickness of the layer decreases. However, if the layer 208 alone is also used as the electrode layer for the moving structure 220, the overlap of the moving structure 220 relative to the static electrode layers 204 and 212 of the fixed fingers 240 may not be sufficient. Moreover, in scenarios with large stimulus and thus large transducer displacement, the moving electrode 220 mostly overlaps with either the electrode layers 204 or 212 of the fixed fingers 240, but not both. In these cases, incremental transducer displacement does not result in a meaningful change in charge and the response becomes nonlinear. One way to increase the extent of the overlap between the moving electrode 220 and the electrode layers 204 and 212 of the fixed fingers 240 is to increase the thickness of the moving electrode 220. For example, the thickness of the moving electrode 220 may fall in a range from about 30 nanometers (nm) to about 3000 nm. In some cases, such as MEMS flow sensors or directional microphones, the thicknesses of the layers 204, 212 may be larger than the thickness of the layer 212.

The multiple electrode layer and thickness variability aspects of the disclosed devices and methods provide the flexibility of making MEMS structures and electrodes with different thicknesses. The moving electrode and the static electrodes are self-aligned so the moving electrode will not collide into fixed electrode along the course of movement, regardless of the thicknesses involved. Another useful feature is that the multiple electrodes provide a way to construct the moving electrode 220 with symmetrical overlap relative to the fixed electrodes 204 and 212. In such configuration, signals generated via the electrode layers 204 and 212 are out of phase. Therefore, a differential signal can be picked up from the electrode layers 202 and 212 to enhance the sensitivity.

FIG. 3A illustrates a compliant transducer with improved linearity and dynamic range in accordance with one example. A fixed finger 340 may be constructed and configured in the same manner as the fixed finger 240 of the example shown in FIG. 2A. In this case, the moving electrode now includes multiple sections. One section is disposed alongside the fixed finger 240, while the other section is not disposed alongside the fixed finger 240. In this example, the moving electrode includes a moving structure 321 and a moving finger 320 to which the moving structure 321 is attached. The moving structure 321 is attached to the substrate 300 on one end (not shown) and free to move at the edge or end at which the moving structure 321 is attached to the moving finger 320.

The moving structure 321 and the moving finger 320 differ in construction or configuration, such as thickness, by including a different number of polysilicon layers. In this example, the moving finger 320 includes a first polysilicon layer 304, a second polysilicon layer 308, and a third polysilicon layer 312. The moving structure 321 only corresponds with, or is composed of or includes, the second polysilicon layer 308. As compared to the moving electrode 220 (FIG. 2A), the moving finger 320 has more overlap area or extent with the fixed electrodes of the fixed fingers 340. By increasing the thickness of the layers 304 and 312, the overlap area or extent between the moving finger 320 and the fixed electrodes 304 and 312 of the fixed fingers 340 can be further increased while the thickness of the second polysilicon layer 308 remains the same. As described above, this configuration improves the linearity of the MEMS device as the moving transducer experiences larger displacements. Because a considerable amount (e.g., most) of the MEMS structure 321 includes only the relatively thin layer 308, the structure still remains sufficiently compliant to respond well to incoming stimulus.

FIG. 3B depicts another cross section of the transducer shown in FIG. 3A to depict how the vertical comb drive transducer may include a plurality of interdigitated moving electrodes 320 and fixed fingers 340. In some cases, some of the fixed fingers 340 may be constructed such that the substrate 300 underneath some of the fixed fingers 240 is removed such that those fixed fingers 320 are suspended.

In some cases, the change in thickness at the boundary between the two parts of the moving electrode is not abrupt (or as abrupt) as shown in FIG. 3A. The change in thickness occurs at the boundary between the electrode layer 308 and the electrode layers 304, 312. For example, the change in thickness may be smooth. To this end, the profile of the electrode layers 304, 312 may be rectangular, circular, elliptical, parabolic, or random. In another embodiment, the curvature of the moving structure 321 may be different than the curvature of the electrode layers 304, 312. In such cases, the thickness of the moving structure 321 may be equal or similar to that of the electrode layers 304, 312, with the increase in electrode overlap merely being achieved due to a non-flat curvature of the transducer.

The electrode layers 304 and 312 may or may not have the same thickness. The thickness of these two layers can be adjusted for better symmetry.

The electrode layer 308 may be a thin layer. For instance, the electrode layer 308 may have a thickness that falls in a range from about 30 nm to about 3000 nm. The electrode layer 308 may be isolated as a dielectric layer or may be connected as another electrode. DC voltage may be applied to the electrode layer 308 to increase or reduce the electrode static force between the fixed finger 340 and the moving electrode 320 (e.g., pulling or pushing, respectively).

Figure 4B:
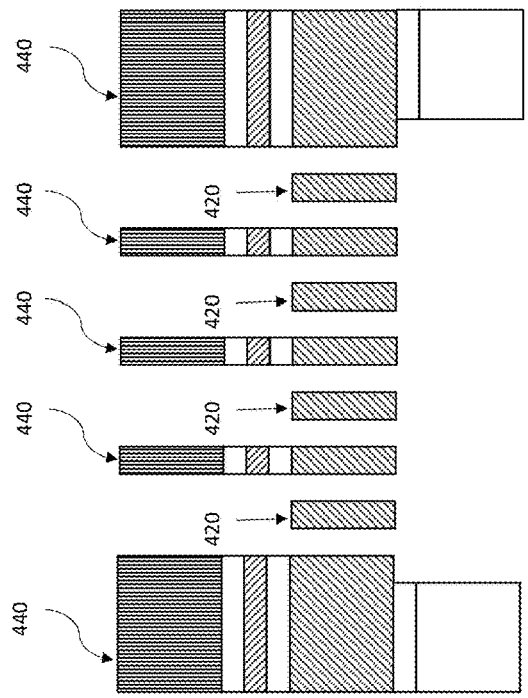
FIGS. 4A and 4B are schematic, cross-sectional views of an electrostatic transducer having a compliant MEMS structure (e.g., a MEMS microphone) with an overlapping arrangement of moving and fixed electrodes in accordance with yet another example.
Figure 4A:
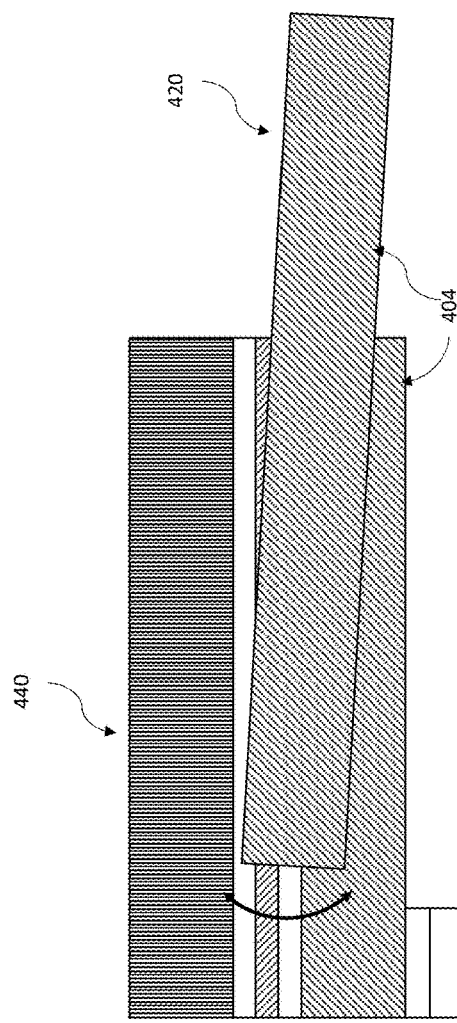

FIG. 4A illustrates a vertical comb drive transducer in accordance with another example. The transducer includes a fixed finger 440 that may be constructed or configured in the same manner as the fixed finger 240 in the example shown in FIG. 2A. In this case, the transducer includes a moving electrode 420 that only corresponds with, or is composed of or includes, a first polysilicon layer 404.

FIG. 4B depicts another cross section of the transducer of FIG. 4A. The cross section depicts the manner in which the vertical comb drive transducer includes interdigitated moving electrodes 420 and fixed fingers 440. In some cases, some of the fixed fingers 440 may be constructed such that the substrate 400 underneath some of the fixed fingers 440 is removed such that the fixed fingers 420 are suspended.

FIG. 5A illustrates a vertical comb drive transducer in accordance with another example. The transducer includes a fixed finger 540 that may be constructed or configured in the same manner as the fixed finger 240 in the example shown in FIG. 2A. In this case, the transducer includes a moving electrode that includes a moving structure 521 and a moving finger 520 to which the moving structure 521 is attached. The moving structure 521 is attached to the substrate 500 on one end (not shown) and free to move at the edge or end of at which the moving structure 521 is attached to the moving finger 520.

The moving finger 520 includes a first polysilicon layer 504, a second polysilicon layer 508, and a third polysilicon layer 512. In this example, the polysilicon layers 512 and 508 of the moving finger 520 are connected but separated from the polysilicon layer 504 by an insulating layer 506. In this example, the moving finger 520 includes two moving electrodes (e.g., because the layers 508 and 512 are in contact with one another). The moving structure 521 includes a first polysilicon layer 504, a second polysilicon layer 508, and a third polysilicon layer 512 separated by the insulating layers 506 and 510 as shown. By using all five of the layers 506, 508, 510, and 512 for the moving structure 321, the moving structure 321 can be made more robust to external stimulus and providing the moving finger 520 with two independent electrodes to be biased or sensed.

FIG. 5B depicts another cross section of the transducer of FIG. 5A to depict the manner in which the vertical comb drive transducer includes interdigitated moving electrodes 520 and fixed fingers 540. In some cases, some of the fixed fingers 540 may be constructed such that the substrate 500 underneath some of the fixed fingers 540 is removed such that the fixed fingers 520 are suspended.

FIG. 6A illustrates a vertical comb drive transducer in accordance with another example. The transducer may include a fixed finger 640 constructed or configured in the same manner as the fixed finger 240 of the example depicted in FIG. 2A. The transducer includes a moving electrode that includes a moving structure 621 and a moving finger 620 to which the moving structure 621 is attached. The moving structure 621 is attached to the substrate 600 on one end (not shown) and free to move at the edge or end at which the moving structure 621 is attached to the moving finger 620.

In this example, the moving finger 620 includes a first polysilicon layer 604, a second polysilicon layer 608, and a third polysilicon layer 612, which are all connected to form a single moving electrode. The moving structure 621 includes the second polysilicon layer 608 and the third polysilicon layer 612. FIG. 6B depicts another cross section to depict the manner in which the vertical comb drive transducer includes interdigitated moving electrodes 620 and fixed fingers 640. In some cases, some of the fixed fingers 640 may be constructed such that the substrate 600 underneath some of the fixed fingers 640 is removed such that the fixed fingers 620 are suspended.

FIG. 7A illustrates a vertical comb drive transducer in accordance with another example. The transducer includes a fixed finger 740 that includes a first polysilicon layer 704 and a second polysilicon layer 708 separated by an insulating or oxide layer 706 to form two separate fixed electrodes. The fixed electrodes are further mounted to, or otherwise disposed on or supported by, a substrate 700 through or via insulator 702. The moving electrode includes a moving structure 721 and a moving finger 720 to which the moving structure 721 is attached. The moving structure 721 is attached to the substrate 700 on one end (not shown) and free to move at the edge (or end) at which the moving structure 721 is attached to the moving finger 720.

In this example, the moving finger 720 includes the second polysilicon layer 708 and a third polysilicon layer 712 to which the second polysilicon layer 708 is connected. The moving structure 721 includes the first polysilicon layer 704, the second polysilicon layer 708, and the third polysilicon layer 712.

FIG. 7B depicts another cross section of the transducer to depict the manner in which the vertical comb drive transducer includes interdigitated moving electrodes 720 and fixed fingers 740. In some cases, some of the fixed fingers 740 may be constructed such that the substrate 700 underneath some of the fixed fingers is removed such that the fixed fingers 720 are suspended.

A number of examples of electrode combinations for vertical comb transducers are described and shown herein. Some of the transducers may be useful in optical MEMS applications. For example, in FIGS. 6A and 6B, the fixed electrode layers 604 and 612 of the fixed finger 640 can be driven with an out-of-phase bias to actuate or move the moving finger 620 and the moving structure 621. The voltage polarization of the layer 612 on the fixed finger 640 attracts the moving finger 620 to move upward while the voltage polarization of the layer 604 on the fixed finger 640 pushes the moving finger 620 upward. Such differential driving schemes may be useful for achieving larger driving force and amplitude with lower driving voltage. Another example is shown in FIGS. 5A and 5B, in which it is possible to implement two electrodes in moving electrodes structures. FIGS. 7A and 7B show that the fixed electrode and moving electrode may be interdigitated like a traditional comb drive. The transducers described herein may thus provide vertically symmetrical electrode configurations without the need to bend or pre-deform the MEMS structure (s).

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. An electrostatic transducer comprising:
a substrate oriented in a plane; and
a plurality of conductive layers supported by the substrate, the plurality of conductive layers being disposed in a stacked arrangement, the stacked arrangement disposing an intermediate conductive layer of the plurality of conductive layers between other conductive layers of the plurality of conductive layers;
wherein a portion of each conductive layer of the plurality of conductive layers defines a fixed electrode supported by the substrate such that the fixed electrode comprises each conductive layer of the plurality of conductive layers; and
wherein the intermediate conductive layer of the plurality of conductive layers has a pattern that defines a moveable structure of a moveable electrode supported by the substrate, the moveable electrode being spaced from the fixed electrode in a first direction parallel to the plane, and configured for movement in a second direction transverse to the plane, such that an extent to which the fixed and moveable electrodes overlap changes during the movement;
wherein the intermediate conductive layer is thinner than the other conductive layers of the plurality of conductive layers.

2. The electrostatic transducer of claim 1, wherein the other conductive layers of the plurality of conductive layers have a same thickness.

3. The electrostatic transducer of claim 1, wherein the stacked arrangement is symmetrical.

4. The electrostatic transducer of claim 1, wherein the stacked arrangement comprises three conductive layers spaced apart from one another.

5. The electrostatic transducer of claim 1, further comprising a dielectric layer disposed between adjacent conductive layers of the stacked arrangement.

6. The electrostatic transducer of claim 1, wherein a portion of the moveable electrode disposed alongside the fixed electrode is defined by the intermediate conductive layer of the plurality of conductive layers.

7. The electrostatic transducer of claim 1, wherein:
the moveable electrode comprises a first section disposed alongside the fixed electrode and a second section not disposed alongside the fixed electrode;
the second section comprises the movable structure; and
the first and second sections include a greater number of the plurality of conductive layers.

8. The electrostatic transducer of claim 7, wherein the first section includes each conductive layer of the plurality of conductive layers.

9. The electrostatic transducer of claim 7, wherein the first section includes multiple conductive layers of the plurality of conductive layers.

10. The electrostatic transducer of claim 1, wherein an entirety of the moveable electrode is defined by the intermediate conductive layer of the plurality of conductive layers.

11. The electrostatic transducer of claim 1, wherein the moveable electrode includes a portion defined by multiple conductive layers of the plurality of conductive layers.

12. The electrostatic transducer of claim 11, wherein the multiple conductive layers are spaced apart from one another.

13. The electrostatic transducer of claim 11, wherein the multiple conductive layers are stacked in contact with one another.

14. The electrostatic transducer of claim 1, wherein:
the fixed electrode is one of a plurality of fixed electrodes supported by the substrate;
the moveable electrode is one of a plurality of moveable electrodes supported by the substrate;
the plurality of fixed electrodes and the plurality of moveable electrodes are disposed in an alternating arrangement.

15. The electrostatic transducer of claim 14, wherein at least one of the plurality of fixed electrodes comprises a fixed finger suspended above the substrate.

16. The electrostatic transducer of claim 1, wherein different voltages are applied to the spaced apart conductive layers of the stacked arrangement.

* * * * *